(12) United States Patent
Brevemark

(10) Patent No.: US 10,609,822 B1
(45) Date of Patent: Mar. 31, 2020

(54) JETTING DEVICES WITH CONTROL VALVE-ENABLED VARIABLE AIR FLOW AND METHODS OF CONTROLLING AIR FLOW

(71) Applicant: Mycronic AB, Taby (SE)

(72) Inventor: Daniel Brevemark, Taby (SE)

(73) Assignee: Mycronic AB, Taby (SE)

( * ) Notice: Subject to any disclaimer, the term of this patent is extended or adjusted under 35 U.S.C. 154(b) by 0 days.

(21) Appl. No.: 16/245,548

(22) Filed: Jan. 11, 2019

(51) Int. Cl.
*H05K 3/12* (2006.01)
*B41J 2/165* (2006.01)
*B41J 3/407* (2006.01)

(52) U.S. Cl.
CPC .......... *H05K 3/125* (2013.01); *B41J 2/16532* (2013.01); *B41J 3/407* (2013.01)

(58) Field of Classification Search
CPC ........ H05K 3/125; B41J 3/407; B41J 2/16532
See application file for complete search history.

(56) References Cited

U.S. PATENT DOCUMENTS

| | | | | |
|---|---|---|---|---|
| 2009/0058925 A1* | 3/2009 | Hayashi | ............... | B41J 2/16511 347/30 |
| 2014/0218438 A1* | 8/2014 | Shinkai | ............... | B41J 2/16523 347/30 |
| 2014/0299157 A1* | 10/2014 | Song | .................... | B41J 2/16532 134/18 |
| 2016/0263896 A1* | 9/2016 | Ono | ..................... | B41J 2/16508 |

* cited by examiner

*Primary Examiner* — Julian D Huffman
(74) *Attorney, Agent, or Firm* — Harness, Dickey & Pierce, P.L.C.

(57) ABSTRACT

A jetting device may include a vacuum nozzle configured to direct a gaseous flow of a gaseous fluid in flow communication with a jetting outlet; a vacuum pump configured to draw the gaseous flow into the vacuum nozzle and further towards the vacuum pump via the vacuum nozzle outlet; and an inlet conduit between a vacuum nozzle inlet and the ambient environment, where the inlet conduit includes a control valve configured to control a flow rate of the gaseous flow through the vacuum nozzle outlet based on adjusting a smallest diameter of the inlet conduit between an open diameter and a constricted diameter. The open diameter may be greater than a smallest diameter of the suction hole. The gaseous flow may include a first gaseous flow into the vacuum nozzle via a suction hole and an adjustable second gaseous flow into the vacuum nozzle via the vacuum nozzle inlet.

26 Claims, 11 Drawing Sheets

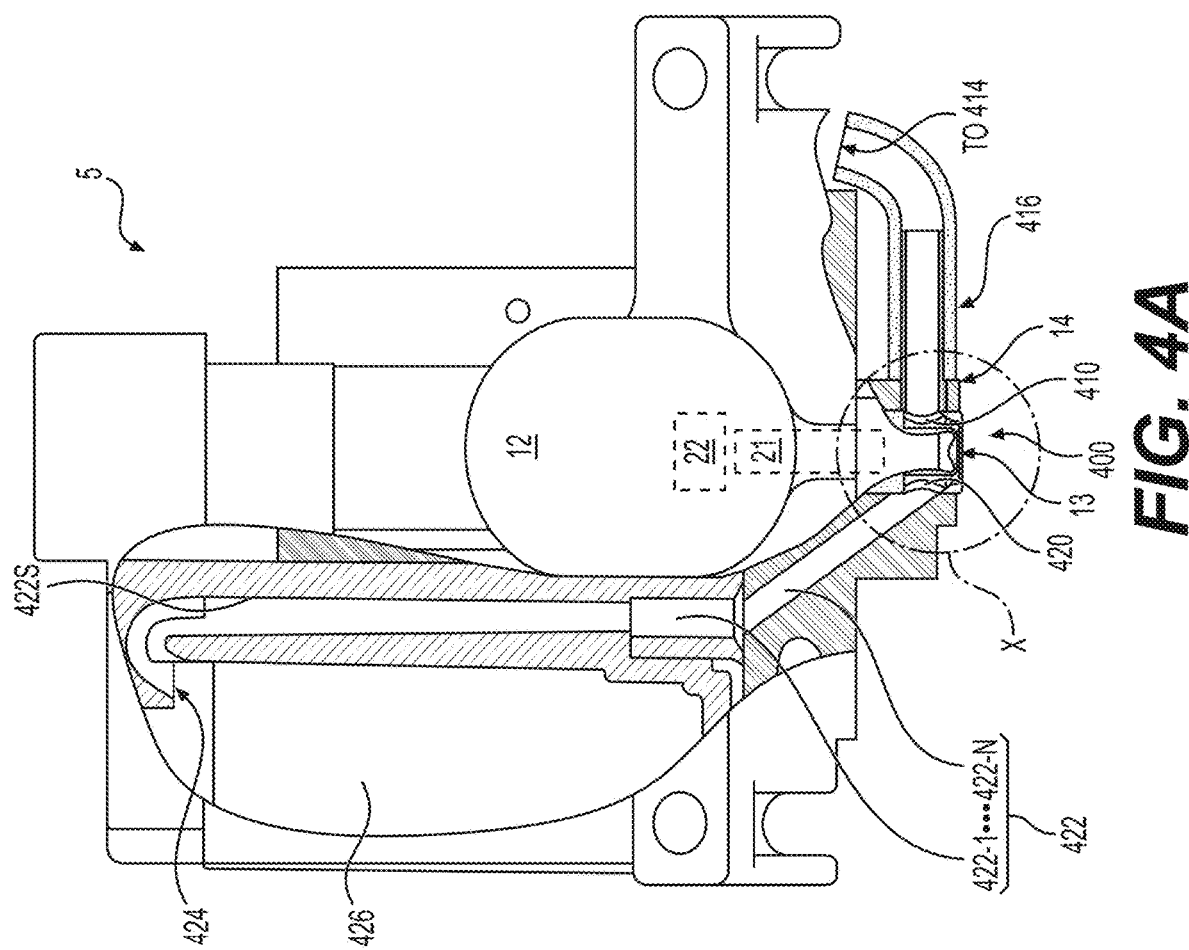

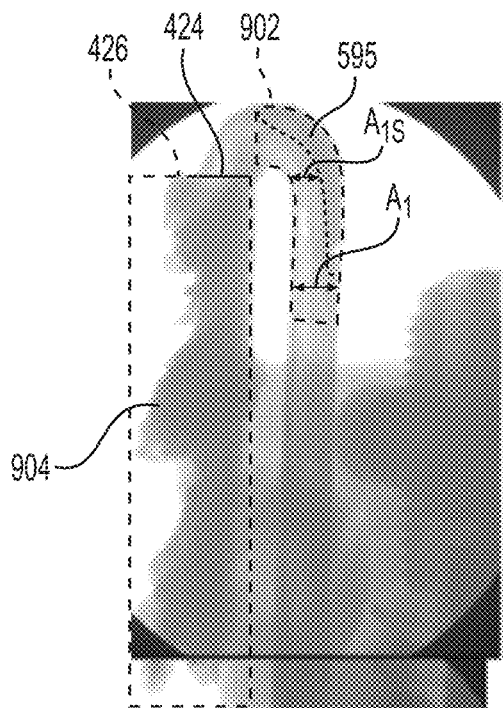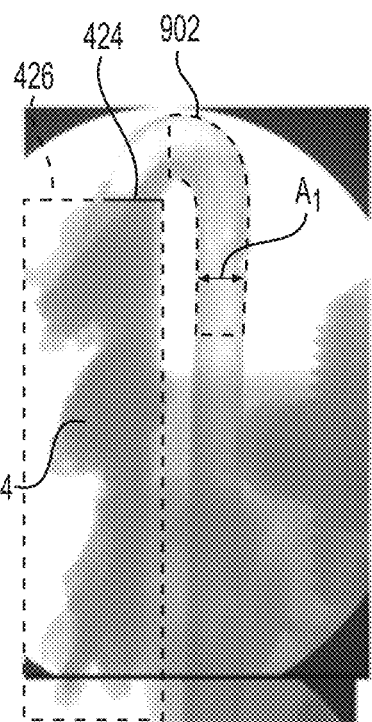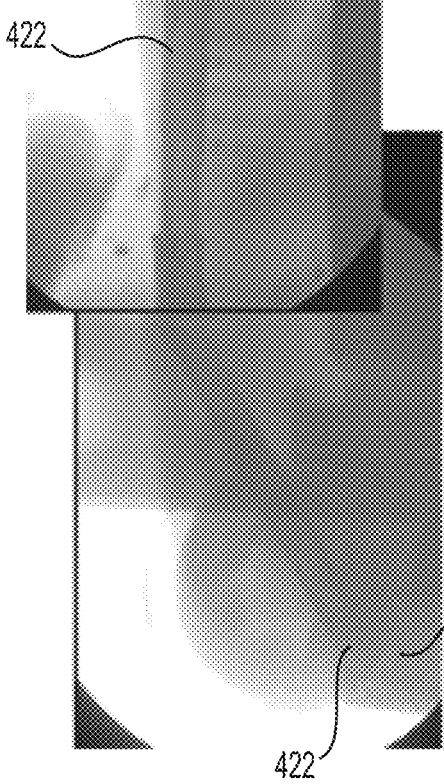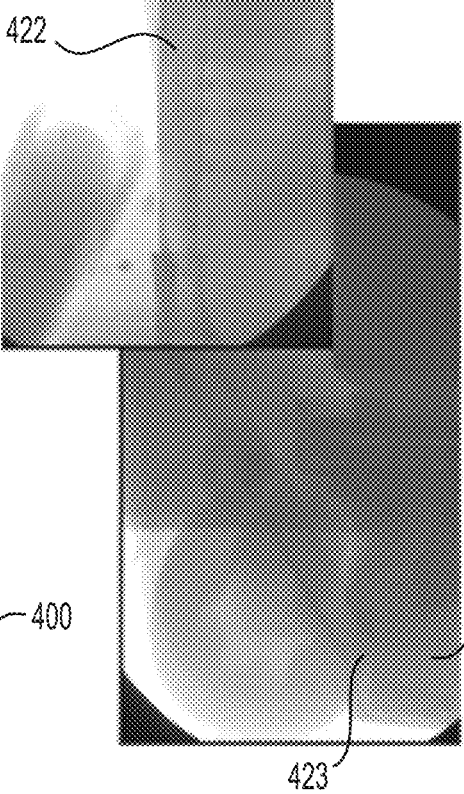
FIG. 9A          FIG. 9B

JETTING DEVICES WITH CONTROL VALVE-ENABLED VARIABLE AIR FLOW AND METHODS OF CONTROLLING AIR FLOW

BACKGROUND

Technical Field

Example embodiments described herein generally relate to the field of "jetting" droplets of a viscous medium onto a substrateMore specifically, the example embodiments relate to improving the performance of a jetting device, and a jetting device configured to "jet" droplets of viscous medium onto a substrate.

Related Art

Jetting devices are known and are primarily intended to be used for, and may be configured to implement, jetting droplets of viscous medium, e.g. solder paste or glue, onto a substrate, e.g. an electronic circuit board, prior to mounting of components thereon.

A jetting device may include a nozzle space (also referred to herein as an eject chamber) configured to contain a relatively small volume of viscous medium prior to jetting, a jetting nozzle (also referred to herein as an eject nozzle) coupled to (e.g., in communication with) the nozzle space, an impacting device configured to impact and jet the viscous medium from the nozzle space through the jetting nozzle in the form of droplets, and a feeder configured to feed the medium into the nozzle space.

Since production speed is a relatively important factor in the manufacturing of electronic circuit boards, the application of viscous medium is typically performed "on the fly" (i.e., without stopping for each location on the workpiece where viscous medium is to be deposited). A further way to improve the manufacturing speed of electronic circuit boards is to eliminate or reduce the need for operator interventions.

In some cases, good and reliable performance of the device may be a relatively important factor in the implementation of the above two measures, as well as a high degree of accuracy and a maintained high level of reproducibility during an extended period of time. In some cases, absence of such factors may lead to unintended variation in deposits on workpieces, (e.g., circuit boards), which may lead to the presence of errors in such workpieces. Such errors may reduce reliability of such workpieces. For example, unintended variation in one or more of deposit size, deposit placement, deposit shape, etc. on a workpiece that is a circuit board may render the circuit board more vulnerable to bridging, short circuiting, etc.

In some cases, good and reliable control of droplet size may be a relatively important factor in the implementation of the above two measures. In some cases, absence of such control may lead to unintended variation in deposits on workpieces, (e.g., circuit boards), which may lead to the presence of errors in such workpieces. Such errors may reduce reliability of such workpieces. For example, unintended variation in one or more of deposit size, deposit placement, deposit shape, etc. on a workpiece that is a circuit board may render the circuit board more vulnerable to bridging, short circuiting, etc.

In some cases, a jetting device may include a vacuum ejector that may induce a gaseous flow (e.g., an air flow) through one or more conduits and past a jetting outlet of a nozzle of the jetting device, such that viscous medium residue that may accumulate at the jetting outlet may be removed. Thus, the jetting device may be configured to prevent an adverse effect on the performance of the jetting device that may result from such accumulation of viscous medium residue.

SUMMARY

According to some example embodiments, a device configured to jet one or more droplets of a viscous medium may include a jetting nozzle, a vacuum nozzle, a vacuum pump, and an inlet conduit. The jetting nozzle may have a jetting outlet. The jetting nozzle may be configured to jet the one or more droplets through the jetting outlet. The vacuum nozzle may be configured to direct a gaseous flow over the jetting outlet. The vacuum nozzle may include a vacuum nozzle inlet, a vacuum nozzle outlet, and a suction hole. The jetting nozzle may be further configured to jet the one or more droplets through the suction hole via the jetting outlet. The vacuum pump may be in flow communication with the vacuum nozzle outlet. The vacuum pump may be configured to generate the gaseous flow based on drawing a gaseous fluid into the vacuum nozzle and further towards the vacuum pump via the vacuum nozzle outlet. The inlet conduit may be coupled to the vacuum nozzle inlet, such that the inlet conduit is between the vacuum nozzle inlet and an ambient environment. The inlet conduit may include a control valve. The control valve may be configured to control a flow rate of the gaseous flow through the vacuum nozzle outlet based on adjusting a smallest diameter of the inlet conduit between an open diameter and a constricted diameter. The open diameter of the inlet conduit may be greater than a smallest diameter of the suction hole.

The open diameter of the inlet conduit may be at least about five-fold greater than the smallest diameter of the suction hole.

The open diameter of the inlet conduit may be about 1.8 millimeters. The smallest diameter of the suction hole may be about 0.23 millimeters.

The vacuum pump may be coupled to the vacuum nozzle outlet via a suction conduit.

The inlet conduit may include an inlet channel. The inlet channel may be between the vacuum nozzle inlet and the control valve.

The inlet conduit may exclude an inlet channel, such that the control valve defines an entirety of the inlet conduit.

The control valve may be configured to change a flow rate of gaseous fluid through the inlet conduit between a first non-zero flow rate to a second non-zero flow rate. The second non-zero flow rate may be different from the first non-zero flow rate.

The vacuum nozzle may define an inner conduit and an outer conduit. The inner conduit may be at least partially defined by the jetting outlet. The outer conduit may be at least partially isolated from the jetting outlet. The vacuum nozzle may be configured to direct a first gaseous flow that is drawn into the vacuum nozzle via the suction hole to be drawn through the inner conduit such that the first gaseous flow flows over the jetting outlet, and direct a second gaseous flow that is drawn into the vacuum nozzle via the vacuum nozzle inlet to flow through the inner conduit and the outer conduit, such that a first portion of the second gaseous flow is drawn through the inner conduit and flows over the jetting outlet, and a separate, second portion of the second gaseous flow is drawn through the outer conduit and does not flow over the jetting outlet.

The vacuum nozzle may define a conduit that is at least partially defined by the jetting outlet and extends over a limited portion of the jetting outlet, the conduit having a cross-sectional flow area that narrows in proportion to proximity to a jetting orifice of the jetting outlet. The vacuum nozzle may be configured to direct an entirety of a first gaseous flow that is drawn into the vacuum nozzle via the suction hole through the conduit, such that the entirety of the first gaseous flow is drawn over the limited portion of the jetting outlet, and direct an entirety of a second gaseous flow that is drawn into the vacuum nozzle via the vacuum nozzle inlet through the conduit, such that the entirety of the second gaseous flow is drawn over the limited portion of the jetting outlet.

According to some example embodiments, a method for controlling a jetting of one or more droplets of a viscous medium through a jetting outlet of a jetting nozzle may include controlling a vacuum pump to cause a gaseous flow of gaseous fluid to be generated and directed towards the vacuum pump via a vacuum nozzle over the jetting outlet. The vacuum nozzle may include a vacuum nozzle inlet, a vacuum nozzle outlet, and a suction hole. The jetting nozzle may be configured to jet the one or more droplets through the suction hole via the jetting outlet. The vacuum nozzle inlet may be in flow communication with an ambient environment via an inlet conduit. The vacuum nozzle outlet may be in flow communication with the vacuum pump. The method may include controlling a control valve of the inlet conduit to adjustably control a flow rate of the gaseous flow through the vacuum nozzle outlet based on adjusting a smallest diameter of the inlet conduit between an open diameter and a constricted diameter, such that the gaseous flow includes a first gaseous flow of gaseous fluid that is drawn into the vacuum nozzle via the suction hole, and an adjustable second gaseous flow of gaseous fluid that is drawn into the vacuum nozzle via the vacuum nozzle inlet.

The open diameter of the inlet conduit may be greater than a smallest diameter of the suction hole.

The method may further include controlling an actuator, according to an actuator control sequence, to jet a sequence of droplets of the viscous medium through the jetting outlet on to a substrate, wherein the controlling the control valve includes controlling the control valve according to a gaseous flow control sequence that corresponds to the actuator control sequence, to control the flow rate of the gaseous flow through the vacuum nozzle outlet based on a jetting of one or more individual droplets of the sequence of droplets by the actuator.

The method may further include controlling the actuator to cause a plurality of sets of droplets of the viscous medium to be jetted through the jetting outlet, each set of droplets including one or more droplets, wherein the controlling the control valve includes increasing or initiating the flow rate of the gaseous flow through the vacuum nozzle outlet at least between causing adjacent sets of droplets to be jetted through the jetting outlet.

The controlling the control valve may include increasing the flow rate of the gaseous flow through the vacuum nozzle outlet to at least a minimum flow rate associated with the gaseous flow removing one or more instances of viscous medium residue from one or more surfaces at least partially defining a suction conduit between the vacuum nozzle outlet and the vacuum pump.

The controlling the control valve may include changing a flow rate of the adjustable second gaseous flow between a first non-zero flow rate and a second non-zero flow rate. The second non-zero flow rate may be different from the first non-zero flow rate.

The method may further include simultaneously triggering an actuator to jet a sequence of droplets of the viscous medium through the jetting outlet on to a substrate and adjusting the control valve.

The controlling the control valve may include reducing or inhibiting the gaseous flow through the vacuum nozzle outlet concurrently with the actuator jetting one or more droplets of the viscous medium.

According to some example embodiments, a device may be configured to at least partially control a jetting device. The jetting device may include an actuator configured to jet a sequence of droplets of a viscous medium through a jetting outlet of the jetting device on to a substrate. The device may include a memory configured to store a program of instructions; and a processor configured to execute the program of instructions to control a vacuum pump to cause a gaseous flow of gaseous fluid to be generated and directed towards the vacuum pump via a vacuum nozzle in flow communication with the jetting outlet. The vacuum nozzle may include a vacuum nozzle inlet, a vacuum nozzle outlet, and a suction hole. The jetting device may be configured to jet the one or more droplets through the suction hole via the jetting outlet. The vacuum nozzle inlet may be in flow communication with an ambient environment via an inlet conduit. The vacuum nozzle outlet may be in flow communication with the vacuum pump. The processor may be configured to execute the program of instructions to control a control valve of the inlet conduit to control a flow rate of the gaseous flow through the vacuum nozzle outlet based on adjusting a smallest diameter of the inlet conduit between an open diameter and a constricted diameter, such that the gaseous flow includes a first gaseous flow of gaseous fluid that is drawn into the vacuum nozzle via the suction hole, and an adjustable second gaseous flow of gaseous fluid that is drawn into the vacuum nozzle via the vacuum nozzle inlet.

The open diameter of the inlet conduit may be greater than a smallest diameter of the suction hole.

The open diameter of the inlet conduit may be at least about five-fold greater than the smallest diameter of the suction hole.

The processor may be further configured to execute the program of instructions to control an actuator, according to an actuator control sequence, to jet a sequence of droplets of the viscous medium through the jetting outlet on to a substrate. The controlling the control valve may include controlling the control valve according to a gaseous flow control sequence that corresponds to the actuator control sequence, to control the flow rate of the gaseous flow through the vacuum nozzle outlet based on a jetting of one or more individual droplets of the sequence of droplets by the actuator.

The processor may be further configured to execute the program of instructions to control the actuator to cause a plurality of sets of droplets of the viscous medium to be jetted through the jetting outlet, each set of droplets including one or more droplets. The controlling the control valve may include increasing or initiating the flow rate of the gaseous flow through the vacuum nozzle outlet at least between causing adjacent sets of droplets to be jetted through the jetting outlet.

The controlling the control valve may include increasing the flow rate of the gaseous flow through the vacuum nozzle outlet to at least a minimum flow rate associated with the gaseous flow removing one or more instances of viscous medium residue from one or more surfaces at least partially defining a suction conduit between the vacuum nozzle outlet and the vacuum pump.

The controlling the control valve may include changing a flow rate of the adjustable second gaseous flow between a first non-zero flow rate and a second non-zero flow rate. The second non-zero flow rate may be different from the first non-zero flow rate.

The processor may be further configured to execute the program of instructions to simultaneously trigger an actuator to jet a sequence of droplets of the viscous medium through the jetting outlet on to a substrate and adjust a valve position of the control valve.

The controlling the control valve may include reducing or inhibiting the gaseous flow through the vacuum nozzle outlet concurrently with the actuator jetting one or more droplets of the viscous medium.

BRIEF DESCRIPTION OF THE DRAWINGS

Some example embodiments will be described with regard to the drawings. The drawings described herein are for illustration purposes only and are not intended to limit the scope of the present disclosure in any way.

FIG. 4A is a cross-sectional view along line IVA-IVA' of the jetting assembly of FIG. 3 according to some example embodiments of the technology disclosed herein.

FIGS. 9A and 9B include images of a suction conduit of a jetting assembly according to some example embodiments of the technology disclosed herein.

DETAILED DESCRIPTION

Figure 1:
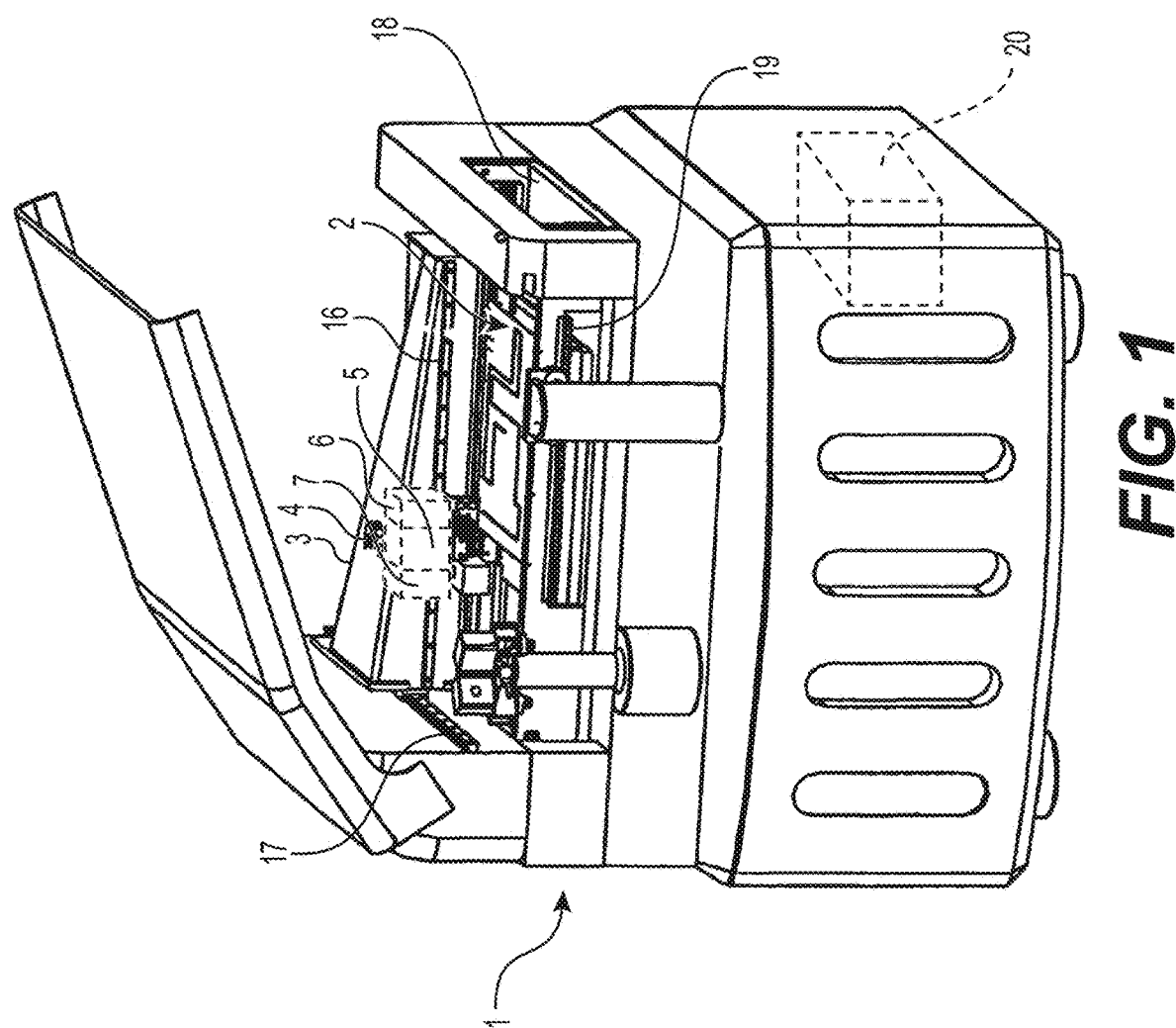
FIG. 1 is a perspective view illustrating a jetting device 1 according to some example embodiments of the technology disclosed herein.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only the example embodiments set forth herein.

It should be understood that there is no intent to limit example embodiments to the particular ones disclosed, but on the contrary example embodiments are to cover all modifications, equivalents, and alternatives falling within the appropriate scope. Like numbers refer to like elements throughout the description of the figures.

Example embodiments of the technology disclosed herein are provided so that this disclosure will be thorough, and will fully convey the scope to those who are skilled in the art. Numerous specific details are set forth such as examples of specific components, devices, and methods, to provide a thorough understanding of implementations of the technology disclosed herein. It will be apparent to those skilled in the art that specific details need not be employed, that example embodiments of the technology disclosed herein may be embodied in many different forms and that neither should be construed to limit the scope of the disclosure. In some example embodiments of the technology disclosed herein, well-known processes, well-known device structures, and well-known technologies are not described in detail.

The terminology used herein is for the purpose of describing particular example embodiments of the technology disclosed herein only and is not intended to be limiting. As used herein, the singular forms "a", "an" and "the" may be intended to include the plural forms as well, unless the context clearly indicates otherwise. The terms "comprises," "comprising," "includes," "including," "has," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments of the technology disclosed herein.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the words "about" and "substantially" are used in this specification in connection with a numerical value, it is intended that the associated numerical value include a tolerance of ±10% around the stated numerical value, unless otherwise explicitly defined.

As discussed herein, "viscous medium" may be solder paste, flux, adhesive, conductive adhesive, or any other kind ("type") of medium used for fastening components on a substrate, conductive ink, resistive paste, or the like. However, example embodiments of the technology disclosed herein should not be limited to only these examples.

A "substrate" may be a board (e.g., a printed circuit board (PCB) and/or a flexible PCB), a substrate for ball grid arrays (BGA), chip scale packages (CSP), quad flat packages (QFP), wafers, flip-chips, or the like.

It is also to be noted that the term "jetting" should be interpreted as a non-contact dispensing process that utilizes a fluid jet to form and shoot one or more droplets of a viscous medium from a jet nozzle onto a substrate, as compared to a contact dispensing process, such as "fluid wetting."

The term "gaseous flow" should be interpreted as a flow of air, compressed air, gas of any suitable type, such as nitrogen, or any other medium of a gaseous type.

The term "deposit" may refer to a connected amount of viscous medium applied at a position on a workpiece as a result of one or more jetted droplets.

For some example embodiments, the solder paste may include between about 40% and about 60% by volume of solder balls and the rest of the volume is solder flux.

In some example embodiments, the volume percent of solder balls of average size may be in the range of between about 5% and about 40% of the entire volume of solid phase material within the solder paste. In some example embodiments, the average diameter of the first fraction of solder balls may be within the range of between about 2 and about 5 microns, while the average diameter of a second fraction of solder balls may be between about 10 and about 30 microns.

The term "deposit size" refers to the area on the workpiece, such as a substrate, that a deposit will cover. An increase in the droplet volume generally results in an increase in the deposit height as well as the deposit size.

In some example embodiments, a jetting device may include an eject chamber communicating with a supply of viscous medium, and a nozzle communicating with the eject chamber. Prior to the jetting of a droplet, the eject chamber may be supplied with viscous medium. Then, the volume of the eject chamber may be rapidly reduced, causing a well-defined amount of viscous medium to be forced with high velocity out of the orifice or exit hole of the nozzle and onto a substrate, thus forming a deposit or dot of viscous medium on the substrate. The jetted amount is hereinafter referred to as a droplet or a jet.

During the actual jetting phase, the jetted viscous medium passes through the orifice of the nozzle and breaks off from the viscous medium remaining in the eject chamber, thus forming a droplet or jet travelling towards the substrate. During an instantaneous moment of the jetting phase, viscous medium passing the orifice is in contact with the orifice surrounding surfaces of the nozzle that are most adjacent to and facing the substrate, i.e. surfaces not being in contact with viscous medium between the jetting phases. The portion of the nozzle surrounding the orifice that is adjacent to and facing the substrate is hereinafter referred to as the "jetting outlet". Thus, the term "jetting outlet" does not include the portions of the nozzle facing the eject chamber, i.e. the portions being in contact with viscous medium between the jetting of droplets.

During a jetting of a droplet of viscous medium (also referred to herein as simply "the medium"), minute amounts of the medium may adhere or stick to the surfaces of the jetting outlet during the brief moment of contact between the surfaces and the viscous medium. This may occur due to the characteristics ("properties") of the viscous medium. For example, the viscous medium may include a so-called "tackifier" to enable the viscous medium to adhere well to a substrate. As a consequence, viscous medium residue may remain attached or adhered to the surfaces of the jetting outlet following the jetting of a droplet.

It should be noted that viscous medium residue refers to the undesired, often minute amounts of viscous medium that breaks off from the droplet during the jetting process. In this context, it refers to the amounts that has become attached to some surface of the jetting device after having been ejected out from the eject chamber. Viscous medium residue may also be referred to herein as viscous medium waste or simply "waste."

According to some example embodiments, a jetting device may be configured to direct a gaseous flow to flow over the jetting outlet, the magnitude ("flow rate") and the velocity ("flow velocity") of the gaseous flow being at least minimally sufficient to transport viscous medium residue away from the area at the jetting outlet with the gaseous flow (e.g., entrain the viscous medium residue in the gaseous flow) towards a waste container, and is further configured to reduce accumulation of the viscous medium residue in a suction conduit between the jetting outlet and the waste container. Thus, the often minute quantities of viscous medium that remains attached to surfaces at the jetting outlet where no residue is desired, following the jetting of a droplet, may be loosened from said surface, entrained in the gaseous flow, and carried away by the gaseous flow without accumulating in a suction conduit between the jetting outlet and a waste container, such that the flow area of the suction conduit may be prevented from being significantly decreased as a result of said accumulation. Also, the gaseous flow provided past the jetting outlet may reduce and/or prevent certain quantities of viscous medium residue to attach to said surfaces in the first place.

As noted above, the presence of viscous medium residue, and the possible accumulation thereof, at the jetting outlet may have an adverse effect on the trajectory of the jetted droplets as they pass the jetting outlet, may interfere with the jetted droplet so as to alter the volume of the droplet, and may cause spattering of viscous medium when a jetted droplet "collides" with the residue. Consequently, some example embodiments of the technology disclosed herein relate to provide a gaseous flow over the jetting outlet of a nozzle of the jetting device (e.g., directing the gaseous flow to pass over the jetting outlet) to reduce and/or prevent an adverse effect on the performance of the jetting device that may result from accumulation of viscous medium residue at the jetting outlet, where providing the gaseous flow may include 1) drawing the gaseous flow through a vacuum nozzle, where the vacuum nozzle extends in flow communication with the jetting outlet, such that the gaseous flow is directed by the vacuum nozzle to flow ("pass") through the vacuum nozzle over the jetting outlet, and such that viscous medium residue that may be accumulated on one or more surfaces in flow communication with the vacuum nozzle, including a surface of the jetting outlet, may be entrained in the gaseous flow and thus carried away from the jetting outlet towards a residue container ("waste container") via a conduit ("suction conduit"), and 2) causing the gaseous flow to, when drawn out of the vacuum nozzle and through the suction conduit, have at least a minimally sufficient flow rate (which may be referred to herein to mean a volumetric flow rate and/or a mass flow rate) to reduce viscous medium residue accumulation in the suction channel, thereby ensuring that the suction conduit retains at least minimally sufficient flow area to support a gaseous flow having at least minimally sufficient flow velocity and/or flow rate to carry viscous medium residue from the jetting outlet towards the residue container. As described herein, "reducing" viscous medium residue accumulation in the suction channel may include reducing viscous medium residue accumulation on one or more surfaces defining one or more portions of the suction channel. Additionally, as described herein, "reducing" viscous medium residue may include removing accumulation from one or more surfaces, mitigating accumulation buildup on one or more surfaces, and/or preventing accumulation buildup on one or more surfaces.

Ensuring that the suction conduit retains at least minimally sufficient flow area to support a gaseous flow having at least minimally sufficient flow velocity and/or flow rate to carry viscous medium residue from the jetting outlet towards the residue container, based on reducing viscous medium residue accumulation in the suction channel, will be understood to improve the performance of the jetting device. For example, removing viscous medium residue accumulation from one or more surfaces that at least partially define the suction channel may reduce or prevent maintenance downtime of the jetting device for mechanical and/or manual removal of viscous medium residue from the suction conduit of the jetting device, thereby improving the operational efficiency and performance of the jetting device.

Some example embodiments of the technology disclosed herein relate to further providing a gaseous flow that mitigates or prevents backflow of viscous medium into the jetting device from the jetting outlet, based on a viscous medium "front" of the viscous medium held in a jetting device being pushed back into the device from the jetting nozzle as a result of an elevated pressure of gaseous fluid being applied to the vacuum nozzle. For example, in some example embodiments the jetting device is configured to generate ("provide") a gaseous flow that is drawn at least partially through the vacuum nozzle and out of the vacuum nozzle and into the suction conduit based on coupling a vacuum pump to the suction conduit, such that the vacuum pump is configured to draw gaseous fluid through and/or out of the vacuum nozzle via the suction conduit to generate the gaseous flow. The vacuum pump may generate the gaseous flow based on reducing a pressure at a point that is in flow communication with the vacuum nozzle via the suction conduit, such that a pressure in the vacuum nozzle and thus the pressure at or near the jetting outlet may be reduced. As a result, the viscous medium "front" in the jetting nozzle may be prevented from being pushed back into the jetting nozzle. Accordingly, the performance of the jetting device may be improved by partially or entirely mitigating the need for the jetting device to perform a purge operation to push the front of the viscous medium back to the jetting outlet, as the gaseous flow that reduces the pressure in the space that is in flow communication with the jetting outlet may enable the front of the viscous medium to remain at or substantially at the jetting outlet (e.g., at the jetting outlet within manufacturing tolerances and/or material tolerances).

Some example embodiments of the technology disclosed herein further relate to controlling a flow rate of the gaseous flow that is drawn through the vacuum nozzle and out of an outlet of the vacuum nozzle, such that the flow rate of the gaseous flow is at least minimally sufficient to reduce viscous medium accumulation in the suction conduit only at certain times associated with a jetting operation. For example, based on control of one or more control valves as described herein, the jetting device may be caused to generate ("induce") a gaseous flow that flows at a first, smaller flow rate over the jetting outlet concurrently with the jetting device jetting one or more droplets of viscous medium through the jetting outlet on to a substrate, such that viscous medium residue may be removed from the jetting outlet during and/or immediately before and/or after jetting the one or more droplets. The jetting device may be further caused to generate a gaseous flow that flows at a second, greater flow rate through at least a portion of the vacuum nozzle and through the outlet of the vacuum nozzle prior and/or subsequent to a sequence of one or more droplets of viscous medium being jetted through the jetting outlet, such that viscous medium residue that has already been removed from the vacuum nozzle and into the suction conduit via the first flow rate of the gaseous flow may be further removed from one or more surfaces at least partially defining the suction conduit. Such control may enable the gaseous flow to have at least a minimally sufficiently low flow rate, concurrently with the jetting of one or more droplets of viscous medium, to mitigate the risk of the droplets being jetted incorrectly on to the substrate or failing to be properly jetted on to the substrate, while the gaseous flow may have at least a minimally sufficiently high flow rate, concurrently with droplets not being jetted through the jetting outlet by the jetting device, to enable viscous medium residue accumulation in the suction conduit to be reduced.

In some example embodiments, the gaseous flow rate may be controlled, based on control valve control, further based on a first droplet in a "strip" of "n" droplets being jetted (each jetted droplet may be referred to herein as a "shot" in a strip). For example, the gaseous flow over the jetting outlet may be initiated and/or increased at a time, t1, prior to the first shot in order to ensure a thorough cleaning of an area around the nozzle and the suction conduit, and the gaseous flow rate may be adjusted to a lower flow rate ("decreased")

at a time t2 before the first droplet is jetted (e.g., the first "shot" of the strip) and the lower flow rate of gaseous flow may be maintained, based on control valve control, until a quantity "n" of shots in the strip have been completed, such that the gaseous flow rate during the jetting of the quantity of shots of the strip is at least minimally sufficiently great to enable viscous medium removal from a proximity of the jetting outlet but not at least minimally sufficiently great to influence a size, shape, and/or trajectory of the jetted one or more droplets, such that the jetting device may be configured to jet droplets having a reduced variation in droplet size, jet droplets having reduced incorporation of residue therein, jet droplets with reduced spattering, etc., relative to a jetting device in which the aforementioned control of the gaseous flow rate is absent. As referred to herein, "n" may be a quantity that is a positive integer number.

A jetting device that is configured to draw a gaseous flow that may have a high flow rate, through at least the outlet of the vacuum nozzle, that is at least minimally sufficient to enable reduction of viscous medium residue in the suction conduit and which may further be configured to control the flow rate of the gaseous flow between the high flow rate and a lower flow rate that is insufficient to influence jetted droplets but is still at least minimally sufficient to remove viscous medium residue from proximity to the jetting outlet within the vacuum nozzle may be a jetting device that includes a vacuum nozzle having both a suction hole for drawing gaseous flow at the lower flow rate (e.g., a first gaseous flow) and for enabling jetted droplets to pass through to a substrate and a separate vacuum nozzle inlet that is coupled to an ambient environment inlet via an inlet conduit, where the inlet conduit may include a control valve configured to control the flow rate of the gaseous flow based on controlling a flow rate of a separate, second gaseous flow to the vacuum nozzle via the inlet conduit, where the first and second gaseous flows may combine to form the gaseous flow that is drawn through the vacuum nozzle outlet to reduce viscous medium residue accumulation in the suction conduit.

As a result of the advantages noted above, a jetting device that includes the vacuum nozzle outlet coupled to the ambient environment inlet via an inlet conduit that includes the control valve may be configured to jet droplets with reduced interference from the above-noted viscous medium residue. The jetted droplets may form deposits on a workpiece to form a board, where the deposits have reduced unintended variation (e.g., improved uniformity, improved repeatability, improved reliability, etc.) in size, form, and/or position based on the reduced interference of the viscous medium residue on the droplets. The board may therefore have reduced susceptibility to errors (e.g., short-circuits across deposits) that may otherwise result from unintended variation in deposits on the board. Thus, the jetting device may at least partially mitigate and/or solve the problem of reduced reliability, performance, and/or lifetime of boards generated via deposits formed on a workpiece via jetting one or more strips of droplets, where the reduced reliability is based on unintended variations in position, form and/or size of the deposits caused by interference by the above-noted viscous medium residue with droplets jetted during the jetting operation.

In some example embodiments, a jetting device may be configured to control (e.g., adjust, initiate, and/or inhibit) a flow rate of the second gaseous flow, via operation of the aforementioned control valve of the inlet conduit, such that the flow rate of the gaseous flow drawn through the vacuum nozzle outlet is controlled according to a particular gaseous flow control sequence. Such a gaseous flow control sequence may be at least partially based on (e.g., may correspond to) a jetting operation executed by the jetting device (e.g., an operation where droplets are jetted by the jetting device according to an actuator control sequence).

For example, the jetting device may be configured to reduce or inhibit the second gaseous flow, thereby reducing the gaseous flow drawn through the vacuum nozzle outlet to only include the first gaseous flow drawn into the vacuum nozzle via the suction hole, concurrently with, or at least a particular (or alternatively, predetermined) amount of time before or after an actuator of the jetting device is controlled, via a control signal transmitted to the actuator, to jet a droplet as part of a jetting operation. As a result, an effect of the increased flow rate of the gaseous flow, resulting from drawing the second gaseous flow into the vacuum nozzle, on the jetting of an individual droplet (e.g., one or more of the size, shape, and positioning of the droplet) may be reduced and/or mitigated. Accordingly, the jetting device may be configured to reduce and/or prevent unintended variation in the positioning and/or size of deposits on a workpiece that may be caused by "head wind" force imparted on the droplets by such a gaseous flow, relative to jetting devices in which such a control configuration is absent. Thus, the jetting device that includes the above-noted control configuration may be configured to provide deposit-bearing workpieces having improved performance and/or reliability, relative to jetting devices in which the above-noted control configuration is absent.

FIG. 1 is a perspective view illustrating a jetting device 1 according to some example embodiments of the technology disclosed herein.

The jetting device 1 may be configured to dispense ("jet") one or more droplets of a viscous medium onto a substrate 2 to generate ("establish," "form," "provide," etc.) a substrate 2 having one or more deposits therein. The above "dispensing" process performed by the jetting device 1 may be referred to as "jetting."

For ease of description, the viscous medium may hereinafter be referred to as solder paste. For the same reason, the substrate may be referred to herein as an electric circuit board and the gaseous fluid may be referred to herein as air.

In some example embodiments, including the example embodiments illustrated in FIG. 1, the jetting device 1 includes an X-beam 3 and an X-wagon 4. The X-wagon 4 may be connected to the X-beam 3 via an X-rail 16 and may be reciprocatingly movable (e.g., configured to be moved reciprocatingly) along the X-rail 16. The X-beam 3 may be reciprocatingly movably connected to a Y-rail 17, the X-beam 3 thereby being movable (e.g., configured to be moved) perpendicularly to the X-rail 16. The Y-rail 17 may be rigidly mounted in the jetting device 1. Generally, the above-described movable elements may be configured to be moved based on operation of one or more linear motors (not shown) that may be included in the jetting device 1.

In some example embodiments, including the example embodiments illustrated in FIG. 1, the jetting device 1 includes a conveyor 18 configured to carry the board 2 (also referred to herein as substrate 2, workpiece 2) through the jetting device 1, and a locking device 19 for locking the board 2 when jetting is to take place.

A docking device may be connected to the X-wagon 4 to enable releasable mounting of a jetting assembly 5 at the docking device. The jetting assembly 5 may be arranged for dispensing droplets of solder paste, i.e. jetting, which impact and form deposits on the board 2. The jetting device 1 also may include a vision device 7. In some example embodiments, including the example embodiments illustrated in FIG. 1, the vision device is a camera. The camera 7 may be used by a control device 20 of the jetting device 1 to determine the position and/or rotation of the board 2 and/or to check the result of the dispensing process by viewing the deposits on the board 2.

In some example embodiments, including the example embodiments illustrated in FIG. 1, the jetting device 1 includes a flow generator 6. In some example embodiments, including the example embodiments illustrated in FIG. 1, the flow generator 6 is a vacuum ejector (also referred to herein as a "vacuum pump") that is arranged ("located," "positioned," etc.) on the X-wagon 4, The vacuum pump 6 may be in communication with the docking device via an air conduit interface which may be connectable to a complementary air conduit interface.

As understood by those skilled in the art, the jetting device 1 may include a control device 20 configured to execute software running the jetting device 1. Such a control device 20 may include a memory storing a program of instructions thereon and a processor configured to execute the program of instructions to operate and/or control one or more portions of the jetting device 1 to perform a "jetting" operation.

In some example embodiments, the jetting device 1 may be configured to operate as follows. The board 2 may be fed into the jetting device 1 via the conveyor 18, upon which the board 2 may be placed. If and/or when the board 2 is in a particular position under the X-wagon 4, the board 2 may be fixed with the aid of the locking device 19. By means of the camera 7, fiducial markers may be located, which markers are prearranged on the surface of the board 2 and used to determine the precise position thereof. Then, by moving the X-wagon over the board 2 according to a particular (or, alternatively, predetermined, pre-programmed, etc.) pattern and operating the jetting assembly 5 at predetermined locations, solder paste is applied on the board 2 at the desired locations. Such an operation may be at least partially implemented by the control device 20 that controls one or more portions of the jetting device 1 (e.g., locating the fiducial markers via processing images captured by the camera 7, controlling a motor to cause the X-wagon to be moved over the board 2 according to a particular pattern, operating the jetting assembly 5, etc.).

Figure 2:
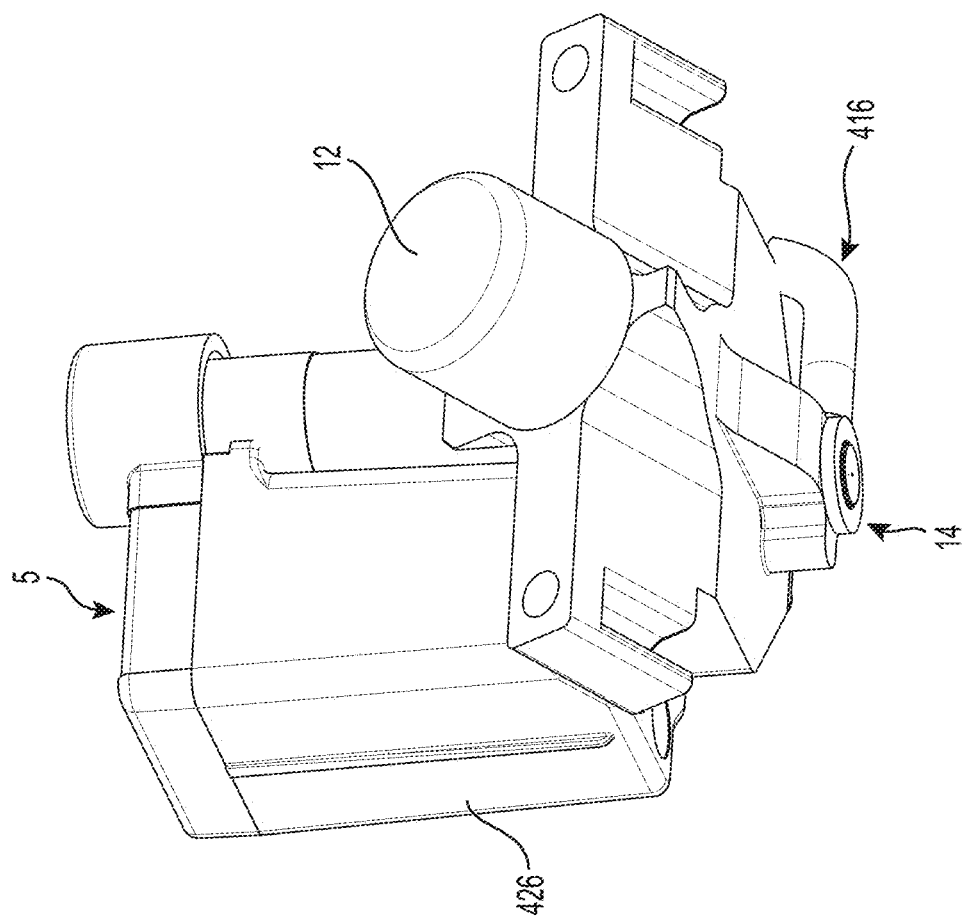
FIG. 2 is a perspective view of a jetting assembly according to some example embodiments of the technology disclosed herein.
Figure 3:
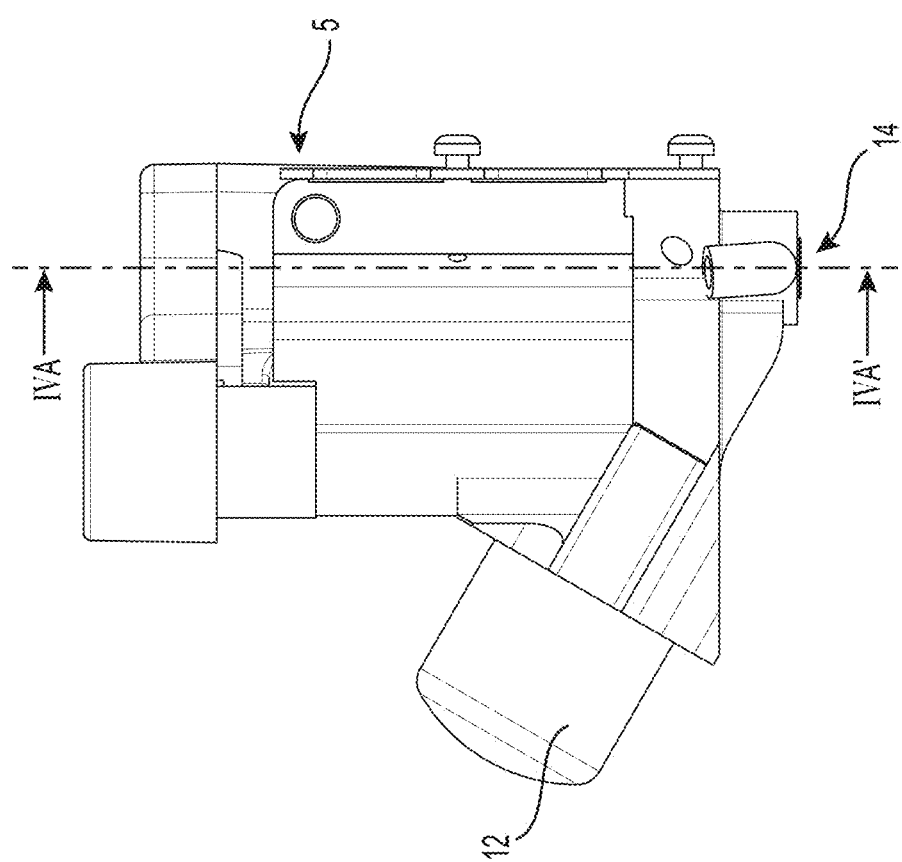
FIG. 3 is a side view of the jetting assembly of FIG. 2 according to some example embodiments of the technology disclosed herein.
Figure 4B:
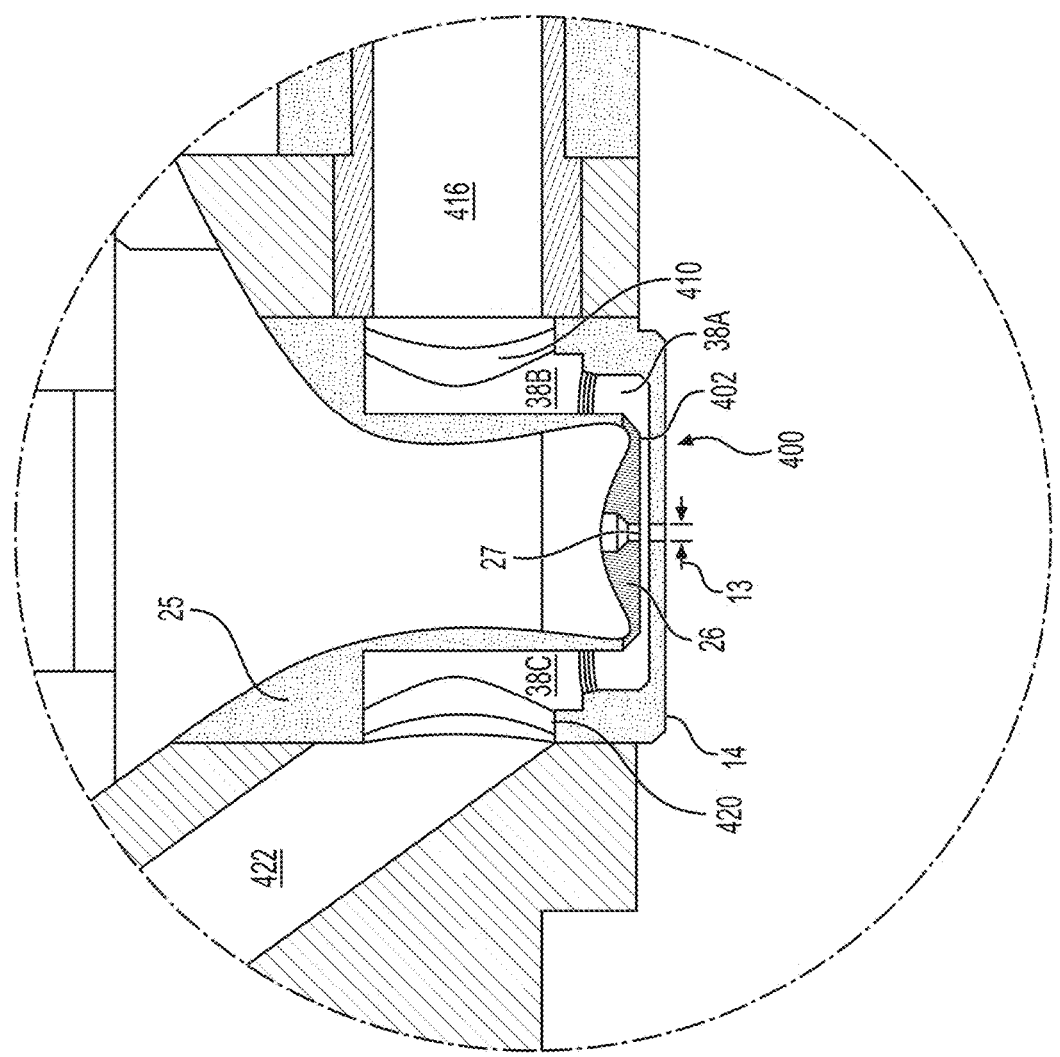
FIG. 4B is an expanded cross-sectional view of region X of the jetting assembly shown in FIG. 4A.
Figure 5:
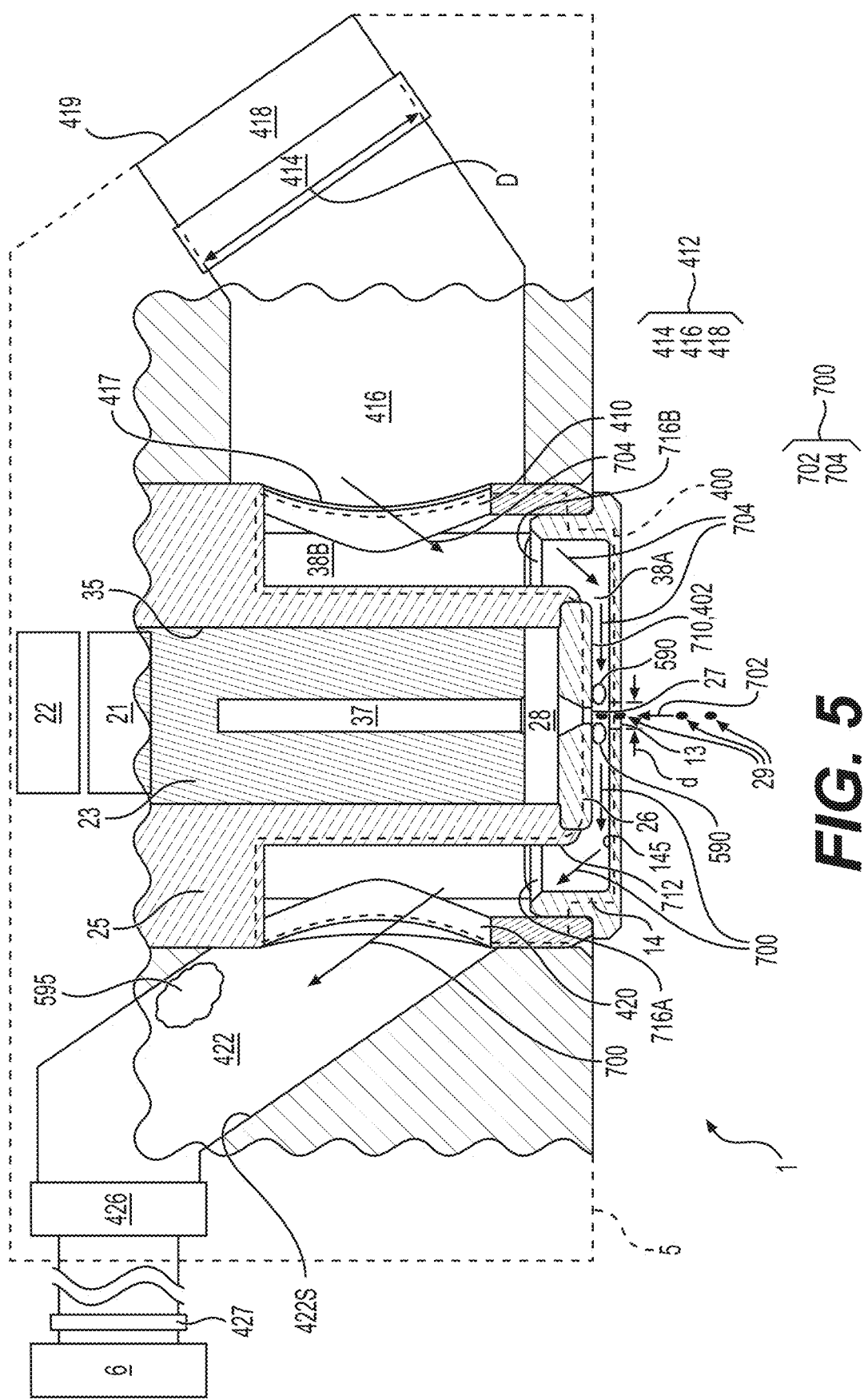
FIG. 5 is a sectional view of a portion of a jetting device according to some example embodiments of the technology disclosed herein.

FIG. 2 is a perspective view of a jetting assembly 5 according to some example embodiments of the technology disclosed herein. FIG. 3 is a side view of the jetting assembly 5 of FIG. 2 according to some example embodiments of the technology disclosed herein. FIG. 4A is a cross-sectional view along line IVA-IVA' of the jetting assembly 5 of FIG. 3 according to some example embodiments of the technology disclosed herein. FIG. 4B is an expanded cross-sectional view of region X of the jetting assembly 5 in FIG. 4A. FIG. 5 is a sectional view of a portion of a jetting assembly 5 according to some example embodiments of the technology disclosed herein. Jetting assembly 5 may be included in one or more example embodiments of a jetting device 1, including the jetting device 1 illustrated in FIG. 1. The jetting device 1 shown in FIG. 5 may be one or more example embodiments of a jetting device 1, including the jetting device 1 illustrated in FIG. 1.

With reference now to FIGS. 2-5, the contents and function of the jetting assembly 5 will be explained in greater detail. In some example embodiments, including the example embodiments illustrated in FIGS. 2-5, the jetting assembly 5 includes an assembly housing 15, an actuator locking screw 22 for supporting an actuator in the assembly housing 15, and a piezoelectric actuator 21 (also referred to herein as simply an "actuator 21") formed by (e.g., at least partially comprising") a number ("quantity") of thin, piezoelectric elements stacked together to form ("at least partially comprise") the actuator 21. The actuator 21 is rigidly connected to the locking screw 22.

In some example embodiments, including the example embodiments illustrated in FIGS. 2-5, the jetting assembly 5 further includes a bushing 25 rigidly connected to the assembly housing 15, and a plunger 23 rigidly connected to the end of the actuator 21, opposite the position of the locking screw 22. The plunger 23 is axially movable while slidably extending through a bore in the bushing 25. The jetting assembly 5 may include cup springs that are configured to resiliently balance the plunger 23 against the assembly housing 15, and to provide a preload for the actuator 21.

In some example embodiments, the jetting device 1 includes a control device 20 that may be configured to apply a drive voltage intermittently to the piezoelectric actuator 21, thereby causing an intermittent extension thereof and hence a reciprocating movement of the plunger with respect to the assembly housing 15, in accordance with solder pattern printing data. Such data may be stored in a memory included in the control device. The drive voltage may be described further herein as including and/or being included in a "control signal," including an "actuator control signal."

In some example embodiments, including the example embodiments illustrated in FIG. 2-5, the jetting assembly 5 includes a jetting nozzle 26 configured to be operatively directed against the board 2, onto which one or more droplets of solder paste may be jetted. The jetting nozzle 26 may include a jetting orifice 27 through which the one or more droplets may be jetted. The surfaces of the jetting nozzle 26 surrounding the jetting orifice 27 and facing the substrate 2 (e.g., the bottom surfaces 710 of the jetting nozzle 26 surrounding the jetting orifice 27 in the example embodiments illustrated in FIGS. 4A-5) will be referred to herein as a jetting outlet 402. The plunger 23 comprises a piston portion which is configured to be slidably and axially movably extended through a piston bore 35, an end surface of said piston portion of the plunger 23 being arranged close to said jetting nozzle 26. An eject chamber 28 is defined by the shape of the end surface of said plunger 23, the inner diameter of the bushing 25 and the jetting orifice 27. Axial movement of the plunger 23 towards the jetting nozzle 26, said movement being caused by the intermittent extension of the piezoelectric actuator 21, will cause a rapid decrease in the volume of the eject chamber 28 and thus a rapid pressurization and jetting through the jetting orifice 27, of any solder paste contained in the eject chamber 28.

Solder paste may be supplied to the eject chamber 28 from the supply container 12, via a feeding device. The feeding device may include an electric motor (not shown) having a motor shaft partly provided in a tubular bore, which extends through the assembly housing 15 to an outlet communicating via a conduit 31 with said piston bore 35. An end portion of the motor shaft may form a rotatable feed screw which is provided in, and coaxial with, the tubular bore. A portion of the rotatable feed screw may be surrounded by an array of resilient, elastomeric a-rings arranged coaxially therewith in the tubular bore, and the threads of the rotatable feed screw may make sliding contact with the innermost surface of the a-rings.

In some example embodiments, the jetting device 1 includes a source of pressurized air that is coupled to the jetting assembly 5 and is configured to supply pressurized air thereto to apply a pressure on the solder paste contained in the supply container 12, thereby feeding said solder paste to an inlet port communicating with the tubular bore. An electronic control signal provided by the control device 20 of the jetting device 1 to the motor may cause the motor shaft, and thus the rotatable feed screw, to rotate a desired angle, or at a desired rotational speed. Solder paste captured between the threads of the rotatable feed screw and the inner surface of the a-rings may then be caused to travel from the inlet port to the piston bore via the outlet port and the conduit, in accordance with the rotational movement of the motor shaft. A sealing a-ring may be provided at the top of the piston bore 35 and the bushing 25, such that any solder paste fed towards the piston bore 35 is prevented from escaping from the piston bore 35 and possibly disturbing the action of the plunger 23.

The solder paste may then be fed into the eject chamber 28 from an outlet port 36 of the tubular bore 30 via the conduit 31 and a channel 37. The channel 37 may be provided in the piston portion of the plunger 23, wherein said channel 37 has includes a portion extending coaxially with and within said plunger 23 to the end surface of the plunger 23 facing the eject chamber 28.

In some example embodiments, including the example embodiments illustrated in at least FIG. 2-5, the jetting assembly 5 includes a support plate 14 located below or downstream of the jetting orifice 27, as seen in the jetting direction. The support plate 14 is provided with a through hole 13, through which the jetted droplets may pass without being hindered or negatively affected by the support plate 14. Consequently, the through hole 13 is concentric with the jetting orifice 27. As described further herein, the through hole 13 is interchangeably referred to as a "suction hole 13."

In some example embodiments, including the example embodiments illustrated in at least FIGS. 2-5, the jetting assembly 5 includes one or more structures (e.g., support plate 14, jetting nozzle 26, and bushing 25) that collectively define a vacuum nozzle 400, where the vacuum nozzle 400 defines first through third gas flow chambers 38A to 38C. As shown in FIGS. 4A-5, the first gas flow chamber 38A is at least partially defined by the jetting outlet 402 (e.g., bottom surface 710 and side surface 712) and an inner surface 14S of the support plate 14, such that the first gas flow chamber 38A includes a disc shaped space that is concentric with the piston bore 35. As further shown in FIGS. 4A-5, the second gas flow chamber 38B that is at least partially defined by the assembly housing 15 and the bushing 25, is in flow communication with (e.g., coupled with such that a fluid may flow therebetween) the first gas flow chamber 38A within the housing 15, extends in parallel with the piston bore 35 and coaxially around the part of the bushing 25 facing the second gas flow chamber 38B. As further shown in FIGS. 4A-5, the third gas flow chamber 38C is at least partially defined by the assembly housing 15 and the bushing 25, is in flow communication with the first gas flow chamber 38A within the housing 15, extends in parallel with the piston bore 35 and coaxially around the part of the bushing 25 facing the third gas flow chamber 38C. As shown in FIG. 5, the second and third gas flow chambers 38B and 38C may be in direct flow communication with separate ends of the first gas flow chamber 38A, such that no interposing spaces or structures are present between the first and second gas flow chambers 38A and 38B and no interposing spaces or structures are present between the first and third gas flow chambers 38A and 38C. As further shown in FIG. 5, the second and third gas flow chambers 38B and 38C may extend along opposite sides of the bushing 25 and thus may be in flow communication with opposite ends of the first gas flow chamber 38A. In some example embodiments, the first through third gas flow chambers 38A to 38C may be a single, continuous gas flow chamber defined by one or more surfaces of the jetting assembly 5. As shown in FIGS. 5-7B, in some example embodiments, the first and second gas flow chambers 38A-38B may be separated from each other by a gaseous flow port 716A extending through surface 714, and the first and third gas flow chambers 38A-38C may be separated from each other by a gaseous flow port 716B extending through surface 714.

As noted above, the vacuum nozzle 400 may be configured to direct a gaseous flow 700 of one or more gaseous fluids that is drawn through at least a portion of the vacuum nozzle 400 over the jetting outlet 402 and further out of the vacuum nozzle 400, where the gaseous flow 700 is generated ("induced") by a vacuum pump 6 that is coupled to, and in flow communication with, the vacuum nozzle 400 via an outlet thereof.

In some example embodiments, and as described herein, it will be understood that vacuum nozzle 400 includes one or more structures that collectively define the first through thirds gas flow chamber 38A-38C and one or more conduits, ports, or the like in flow communication therewith. For example, as shown in at least FIG. 5, the vacuum nozzle 400 includes a vacuum nozzle inlet 410 and a vacuum nozzle outlet 420, where the vacuum nozzle inlet 410 and the vacuum nozzle outlet 420 are coupled to separate gas flow chambers 38B and 38C that are in direct flow communication with opposite ends of the first gas flow chamber 38A of the vacuum nozzle 400. Additionally, the vacuum nozzle 400 includes the suction hole 13.

In some example embodiments, including the example embodiments shown in at least FIG. 5, the vacuum nozzle outlet 420 is coupled in flow communication with the vacuum pump 6 via one or more conduits 422-1 to 422-N (N being a positive integer) that define a suction conduit 422. The suction conduit 422 may have an inner diameter of about 6 millimeters. As further shown in FIGS. 2-5, the jetting assembly 5 includes a filter box 426 that is coupled to the vacuum nozzle outlet 420 via the suction conduit 422, such that one end 423 of the suction conduit 422 is connected to the vacuum nozzle outlet 420 and the other end 424 of the suction conduit 422 is connected to the filter box 426. The filter box 426 includes a waste container and a filter assembly, where the filter box 426 is further coupled to and in flow communication with the vacuum pump 6 through the filter assembly of the filter box 426 via a vacuum conduit 428. As further shown in FIG. 5, the jetting device 1 may include a control valve 427 coupled to the vacuum conduit 428, where the control valve 427 may be configured to be controlled by the control device 20 to control flow communication from at least the filter box 426 to the vacuum pump 6 via the vacuum conduit 428.

In some example embodiments, and as described further below with reference to FIGS. 6A-8, the vacuum pump 6 may be configured to generate a gaseous flow 700, of one or more gaseous fluids, that is drawn through at least a portion of the vacuum nozzle 400 in flow communication with the jetting outlet 402 and is further drawn through the vacuum nozzle outlet 420 towards the vacuum pump 6.

In some example embodiments, the vacuum pump 6 may generate a gaseous flow 700 that may include an individual gaseous flow or a combination of separate gaseous flows that are drawn into the vacuum nozzle 400 via separate inlet ports. For example, as shown in FIG. 5 and as further shown in FIGS. 6A and 7A, the vacuum pump 6 may, in some example embodiments, cause a first gaseous flow 702 of gaseous fluid (e.g., air) to be drawn into the first gas flow chamber 38A of the vacuum nozzle 400 via the suction hole 13 and may further cause the first gaseous flow 702 to be drawn from the first gas flow chamber 38A to the third gas flow chamber 38C and further to be drawn, through the vacuum nozzle outlet 420 and the suction conduit 422, towards the vacuum pump 6, such that the generated gaseous flow 700 that is drawn out of the vacuum nozzle 400 via the vacuum nozzle outlet 420 and via the suction conduit 422 includes the first gaseous flow 702. As shown in at least FIGS. 6A and 7A below, the first gaseous flow 702 of gaseous fluid may be drawn into the vacuum nozzle 400 through the suction hole 13, such that the first gaseous flow 702 is directed to flow "radially over" the jetting outlet 402 as shown by the flow arrows in FIGS. 6A and 7A.

Referring to FIGS. 5-7B, at least the first gaseous flow 702 of the gaseous flow 700 of gaseous fluid that is drawn into the vacuum nozzle 400, drawn at least partially through the vacuum nozzle 400 such that at least the first gaseous flow 702 passes through the vacuum nozzle 400 over the jetting outlet 402 of the jetting nozzle 26, may remove solder paste residue ("viscous medium residue") 590 that is present and/or has accumulated on one or more surfaces defining the first gas flow chamber 38A, including residue on the jetting outlet 402, surface 710, surface 712, surface 714, surface 718, and/or the inner surface 14S of the support plate 14. Such viscous medium residue 590 may be referred to herein as viscous medium residue that is on or near the jetting outlet 402, viscous medium residue that is in the vacuum nozzle 400, or a combination thereof. Such viscous medium residue 590 that is removed by one or more portions of the gaseous flow 700 (e.g., the first gaseous flow 702) may be entrained in the one or more portions of the gaseous flow 700 (e.g., entrained in the first gaseous flow 702), which the vacuum pump 6 is drawing towards itself, and thus the entrained residue 590 may be drawn out of the vacuum nozzle 400, via the vacuum nozzle outlet 420, to the filter box 426 via the suction conduit 422. The filter box 426 may be referred to as a waste containment system that is configured to capture the viscous medium residue 590 that is removed from the vacuum nozzle 400 (also referred to herein as simply "waste").

While the example embodiments shown in FIGS. 2-5 illustrate a jetting assembly 5 that includes the filter box 426 as a portion thereof, it will be understood that, in in some example embodiments, the filter box 426 and the vacuum pump 6 may be external to the jetting assembly 5. For example, in some example embodiments, the vacuum pump 6 is external to the jetting device 1. Furthermore, in some example embodiments, the filter box 426 is external to the jetting device 1, such that the gaseous flow is directed out of the jetting device 1, thereby removing the entrained waste from the jetting device 1.

In some example embodiments, the suction hole 13 may have a smallest diameter "d" of about 0.4 millimeters. In some example embodiments, the smallest diameter of the suction hole 13 is a relatively small diameter "d" of about 0.23 millimeters. The smallest diameter "d" of the suction hole 13 may affect velocity and direction of the first gaseous flow 702. In some example embodiments, based on the smallest diameter "d" of the suction hole 13 being relatively small (e.g., about 0.23 millimeters) configures the vacuum nozzle 400 to enable a first gaseous flow 702 having an elevated flow velocity to improve removal of viscous medium residue 590 from the vacuum nozzle 400. In some example embodiments, a jetting device 1 that is configured to jet one or more droplets of ever smaller volume and droplet size may include a relatively small jetting nozzle 26 diameter, and thus a relatively small jetting outlet 402 diameter. In order to maintain the cleaning around the jetting outlet 402, the suction hole 13 may be reduced in smallest diameter "d" to increase the flow velocity of the portion of the gaseous flow 700 (e.g., the first gaseous flow 702) that is drawn over the jetting outlet 402. For example, a jetting device 1 that is configured to jet one or more droplets of viscous medium having a diameter of about 300-500 μm may include a jetting nozzle 26 with a jetting orifice 27 having a diameter of about 0.15 millimeters may further include a suction hole smallest diameter "d" of about 0.4 millimeters. In another example, a jetting device 1 that is configured to jet one or more droplets of viscous medium having a diameter of about 200-300 μm may include a jetting nozzle 26 with a jetting orifice 27 having a diameter of about 0.1 millimeters may further include a suction hole smallest diameter "d" of about 0.23 millimeters. The reduction in suction hole 13 smallest diameter "d" may result in a jetting device 1 that is configured to avoid adverse jet performance when the dots on the board 2 merge together called bridging.

In some example embodiments, based on the smallest diameter "d" of the suction hole 13 being relatively small, the flow rate (e.g., volumetric flow rate) of the first gaseous flow 702 may be restricted as a result of the relatively small smallest flow area of the suction hole 13. In some example embodiments, a gaseous flow 700 that is entirely comprised of the first gaseous flow 702 may have a flow rate that is insufficient to transport the viscous medium residue 590 through an entirety of the suction conduit 422 to the filter box 426, such that at least some of the viscous medium residue 590 that is entrained in the gaseous flow 700 that is drawn out of the vacuum nozzle 400 and into the suction conduit 422 via the vacuum nozzle outlet 420 may fall out of the gaseous flow 700 and may accumulate on one or more surfaces 422S of the suction conduit 422; such accumulation may be referred to herein as viscous medium residue accumulation 595.

For example, a jetting device 1 that includes a suction hole 13 of relatively small smallest diameter (e.g., "d" is about 0.23 millimeters) may be configured to draw a first gaseous flow 702 having a flow rate of about 0.3 liters/minute, such that the flow rate of the gaseous flow 700 drawn out of the vacuum nozzle 400 and through the suction conduit 422 may be about 0.3 liters/minute when the gaseous flow 700 entirely comprises the first gaseous flow 702, and while the flow rate of the first gaseous flow 702 (e.g., about 0.3 liters/minute) may be at least minimally sufficient to enable removal of viscous medium residue 590 from the vacuum nozzle 400, such a flow rate of the gaseous flow 700 may be insufficient to prevent accumulation of viscous medium residue accumulation 595 on one or more surfaces of the suction conduit 422. In some example embodiments, viscous medium residue accumulation 595 in the suction conduit 422 may reduce a flow area of the suction conduit 422 until a semi-clogged state is entered where the "clog" of viscous medium residue accumulation 595 is released from the one or more surfaces of the suction conduit 422 in a wave or avalanche like manner, which may influence the gaseous flow 700 flow rate and may influence jetting quality with adverse effects summarized as a quality crash. The quality of the droplets jetted by the jetting device may, as a result, "crash" under a series of multiple shots, often hundreds to thousands in a row that have very poor quality, bad positioning, volume and shape on the substrate.

Still referring to FIGS. 2-5, in some example embodiments, the jetting device 1 includes an inlet conduit 412 that is connected, at a first end 417, to the vacuum nozzle inlet 410 and is further connected, at the other end 419, to an ambient environment that is external to the jetting device 1. The end 419 of the inlet conduit 412 may be referred to herein as an ambient conduit inlet 419. The vacuum nozzle inlet 410 may be in flow communication with an ambient environment via the inlet conduit 412.

Accordingly, in some example embodiments, when the vacuum pump 6 generates a gaseous flow 700 through the vacuum nozzle 400, the vacuum pump 6 may cause a second gaseous flow 704 of gaseous fluid (e.g., ambient air) to be drawn into the vacuum nozzle 400 (e.g., the second gas flow chamber 38B) via the ambient conduit inlet 419, the inlet conduit 412, and the vacuum nozzle inlet 410, and the second gaseous flow 704 may further be drawn through the vacuum nozzle 400 (e.g., through the first to third gas flow chambers 38A-38C), in combination with the first gaseous flow 702, to the vacuum nozzle outlet 420, such that the gaseous flow 700 that is drawn through the vacuum nozzle outlet 420 and into the suction conduit 422 may be a combination of the first and second gaseous flows 702 and 704 and thus may have a flow rate that is a combination of the respective flow rates of the first and second gaseous flows 702 and 704. It will be understood that, in some example embodiments, the gaseous fluid drawn into the vacuum nozzle 400 via the hole 13 and the gaseous fluid drawn into the vacuum nozzle 400 via the inlet conduit 412 may both be the same type or kind of gaseous fluid (e.g., both gaseous fluids may be ambient air).

In some example embodiments, the inlet conduit 412 may have a smallest diameter "D" that is greater than the smallest diameter "d" of the suction hole 13, such that the maximum flow rate of the second gaseous flow 704 that may be drawn into the vacuum nozzle 400 via the inlet conduit 412 may be greater than the maximum flow rate of the first gaseous flow 702 that may be drawn into the vacuum nozzle 400 via the suction hole 13, such that the jetting device 1 may be configured to draw a second gaseous flow 704 that provides a "boost" of the flow rate of the combined gaseous flow 700 that is drawn out of the vacuum nozzle 400 and into the suction conduit 422. For example, in some example embodiments, the smallest diameter "D" of the inlet conduit 412 may be about 1.0 millimeters, which may be about five-fold greater than a smallest diameter "d" of the suction hole 13 (e.g., about 0.23 millimeters). In some example embodiments, when the smallest diameter "D" of the inlet conduit 412 is at least about five-fold greater than the smallest diameter "d" of the suction hole 13, such a difference in diameters between the diameters "D" and "d" may be a sufficient difference to enable the flow rate of the gaseous flow 700 to be changed between a first flow rate, based on the gaseous flow 700 comprising the first gaseous flow 702 drawn through the suction hole 13, that is sufficient to remove viscous medium residue from the vacuum nozzle 400 and/or jetting outlet 402 without influencing droplets 29 jetted from the jetting outlet 402 and a second flow rate, based on the gaseous flow 700 comprising the first gaseous flow 702 (drawn through the suction hole 13) and the second gaseous flow 704 (drawn through the inlet conduit 412), that is sufficient to reduce viscous medium residue from the suction conduit 422. In another example, in some example embodiments, the smallest diameter "D" of the inlet conduit 412 may be about 1.8 millimeters, which may be about eight-fold greater than a smallest diameter "d" of the suction hole 13 (e.g., about 0.23 millimeters). In such example embodiments, the maximum flow rate of the second gaseous flow 704 may be significantly greater than the maximum flow rate of the first gaseous flow 702, such that the flow rate of a gaseous flow 700 that includes a combination of the first and second gaseous flows 702 and 704 may be significantly greater than a flow rate of a gaseous flow 700 that entirely includes the first gaseous flow 702 and thus omits the second gaseous flow 704. For example, a flow rate of a gaseous flow 700 that includes both the first and second gaseous flows 702 and 704 may be about 3 liters/minute to about 4 liters/minute, while a flow rate of a gaseous flow 700 that includes only the first gaseous flow 702 may be about 0.3 liters/minute. Accordingly, in some example embodiments, a jetting device 1 that includes the inlet conduit 412 may be configured to "boost" the flow rate of the gaseous flow 700 about ten-fold (e.g., about 0.3 liters/minute to about 3-4 liters/minute) based on drawing the second gaseous flow 704 into the vacuum nozzle 400 in addition to drawing the first gaseous flow 702 into the vacuum nozzle 400, such that the vacuum nozzle 400 includes a combination of the first and second gaseous flows 702 and 704.

In some example embodiments, and as described further below with reference to FIGS. 9A and 9B, a gaseous flow 700 that includes a combination of the first and second gaseous flows 702 and 704 may have an elevated flow rate (e.g., about 3-4 liters/minute) that is at least minimally sufficient to reduce accumulation of viscous medium residue 595 on one or more surfaces 422S that at least partially define the suction conduit 422. Such viscous medium residue 595, which may be removed from the vacuum nozzle 400 as viscous medium residue 590 as described above, might accumulate on one or more surfaces 422S of the suction conduit 422, and the increased flow rate and/or flow velocity of a gaseous flow 700, drawn through the suction conduit 422, that includes a combination of the first and second gaseous flows 702 and 704 may reduce such accumulation of viscous medium residue 595 and thus preclude the effective flow area of the suction conduit 422 from being reduced as a result of said accumulation to such a degree that the ability of the vacuum pump 6 and vacuum nozzle 400 to enable viscous medium residue 590 removal from the jetting outlet 402 to be partially or entirely impaired and/or the ability of the jetting device 1 to consistently jet one or more droplets of viscous media to be impaired. Additionally, the increased flow rate of a of a gaseous flow 700, drawn through the suction conduit 422, that includes a combination of the first and second gaseous flows 702 and 704 may reduce, mitigate, and/or preclude the jetting device 1 from being taken off-line for a maintenance operation to mechanically and/or manually remove viscous medium residue 595 accumulation from the suction conduit 422 surfaces 422S. Accordingly, the performance of the jetting device 1 may be improved as a result of the jetting device 1 including a vacuum nozzle 400 having a vacuum nozzle inlet 410 that is in flow communication with an ambient environment via the inlet conduit 412.

As shown in at least FIG. 5, the inlet conduit 412 may include a control valve 414 and may further include one or more inlet channels 416, 418 that collectively define the inlet conduit 412. It will be understood that, in some example embodiments, the one or more inlet channels 416, 418 may be omitted from the jetting device 1, such that control valve 414 defines an entirety of the inlet conduit 412 and is directly connected to the vacuum nozzle inlet 410 and controls exposure of the vacuum nozzle inlet 410 to the ambient environment. In some example embodiments, only one of the inlet channels 416 may be included in the jetting device 1. In some example embodiments, including the example embodiments shown in FIG. 2-4B, at least the control valve 414 and the ambient conduit inlet 419 of the inlet conduit 412 may be external to the jetting assembly 5 and may be included elsewhere in the jetting device 1. For example, the control valve 414 may be included in one or more of an ejector of the jetting device 1, a holder of the jetting device, a machine of the jetting device, a combination thereof, or the like.

As described further below with reference to FIG. 8, in some example embodiments the control valve 414 is configured to be actuated between separate valve positions to adjust a smallest effective flow area of the inlet conduit 412, and thus to adjust a smallest diameter "D" of the inlet conduit 412, between an "open diameter" that corresponds to a fully-open valve position of the control valve 414 that enables a maximum flow rate of the second gaseous flow 704 and a "constricted diameter" that is smaller than the "open diameter" and corresponds to a constricted valve position of the control valve 414 and that at least partially restricts the flow rate of the second gaseous flow 704 to be less than the maximum flow rate of the second gaseous flow. In some example embodiments, the "constricted diameter" is a value that corresponds to a fully-closed valve position of the control valve and that inhibits the second gaseous flow 704 from being drawn through the control valve 414 and into the vacuum nozzle 400. In view of the above, it will be understood that the control valve 414 may be configured to adjustably control a flow rate of the gaseous flow 700 through the vacuum nozzle outlet 420 based on adjusting a smallest diameter "D" of the inlet conduit 412 between an open diameter and a constricted diameter, thereby controlling a contribution of the second gaseous flow 704 to the total flow of the gaseous flow 700. Accordingly, the gaseous flow 700 may include at least a first gaseous flow 702 of gaseous fluid that is drawn into the vacuum nozzle 400 via the suction hole 13 and may further include an adjustable second gaseous flow 704 of gaseous fluid that may be drawn into the vacuum nozzle 400 via the vacuum nozzle inlet 410.

In some example embodiments, the control valve 414 is an open/close solenoid valve that is configured to be actuated to either a fully-open valve position (enabling a maximum flow rate of gaseous fluid therethrough or a fully-closed valve position (inhibiting any flow of the gaseous fluid therethrough). But it will be understood that example embodiments of the control valve 414 are not limited to an open/close solenoid valve. For example, the control valve 414 may be a piezoelectric valve.

In some example embodiments, based on the jetting device 1 being configured to generate a gaseous flow 700 that includes, in addition to the first gaseous flow 702, a second gaseous flow 704 that is drawn into the vacuum nozzle 400 from an ambient environment based on operation of the vacuum pump 6 may partially or entirely mitigate application of a pressurized gas source to provide the second gaseous flow 704. As a result, the need to take the jetting device 1 off-line to move the jetting assembly 5 to a location where pressurized gaseous fluid may be applied to the vacuum nozzle 400 from a pressurized gas source to implement reduction of viscous medium residue 595 from the suction conduit 422 may be mitigated, thereby improving jetting device 1 performance and operational efficiency.

In some example embodiments, based on the gaseous flow 700 including a second gaseous flow 704 that is drawn into the vacuum nozzle 400 based on operation of the vacuum pump 6 instead of application of the second gaseous flow 704 from a pressurized gas source, the gaseous flow that is drawn over the jetting outlet 402 may be caused due to a negative pressure in the jetting device that is induced by the vacuum pump 6, such that the pressure in the vacuum nozzle 400 is reduced. As a result, a "front" of the viscous medium in the jetting nozzle 26 may be precluded from being pushed back into the chamber 28 and away from the jetting orifice 27 by an elevated pressure in the vacuum nozzle 400. Accordingly, penetration of gaseous fluid into the jetting nozzle 26 interior, and thus the need for a purge operation to purge said gaseous fluid from the jetting nozzle 26 interior and to return the "front" of the viscous medium to the jetting orifice such that the chamber 28 is completely filled with viscous medium subsequent to a "boosted" gaseous flow 700 that includes the second gaseous flow 704 may be partially or entirely mitigated.

Figure 6A:
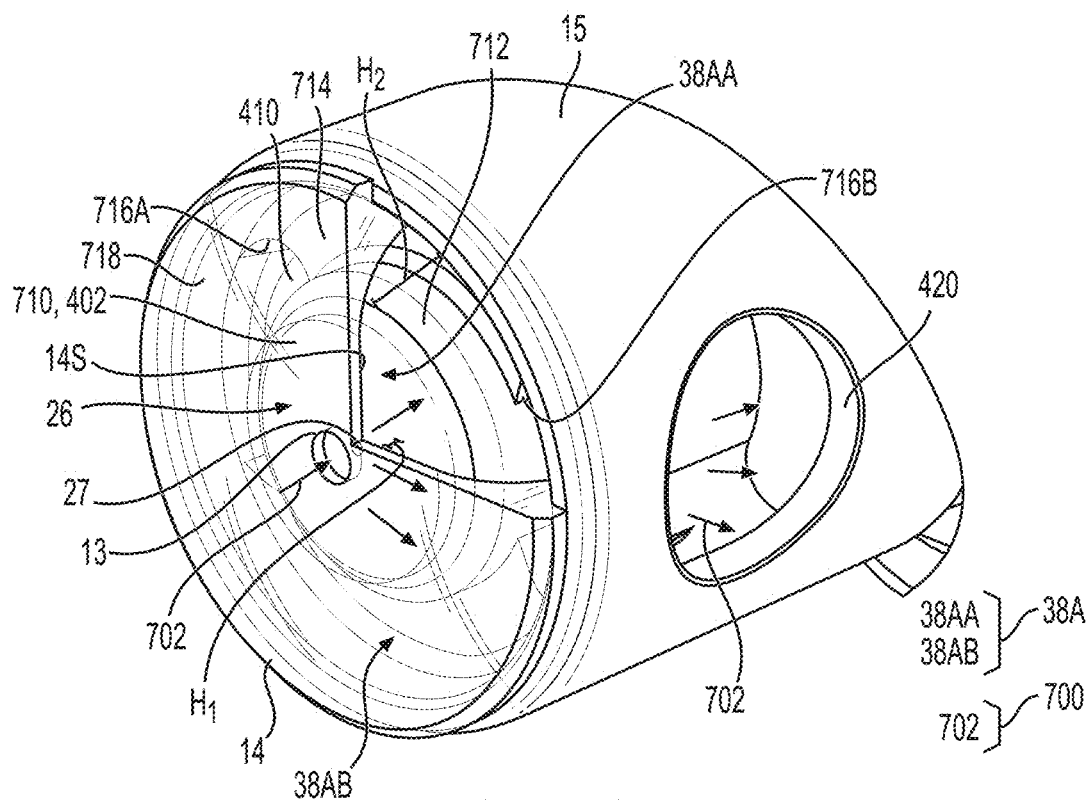
FIG. 6A is a perspective view of a portion of a jetting assembly according to some example embodiments of the technology disclosed herein.
Figure 6B:
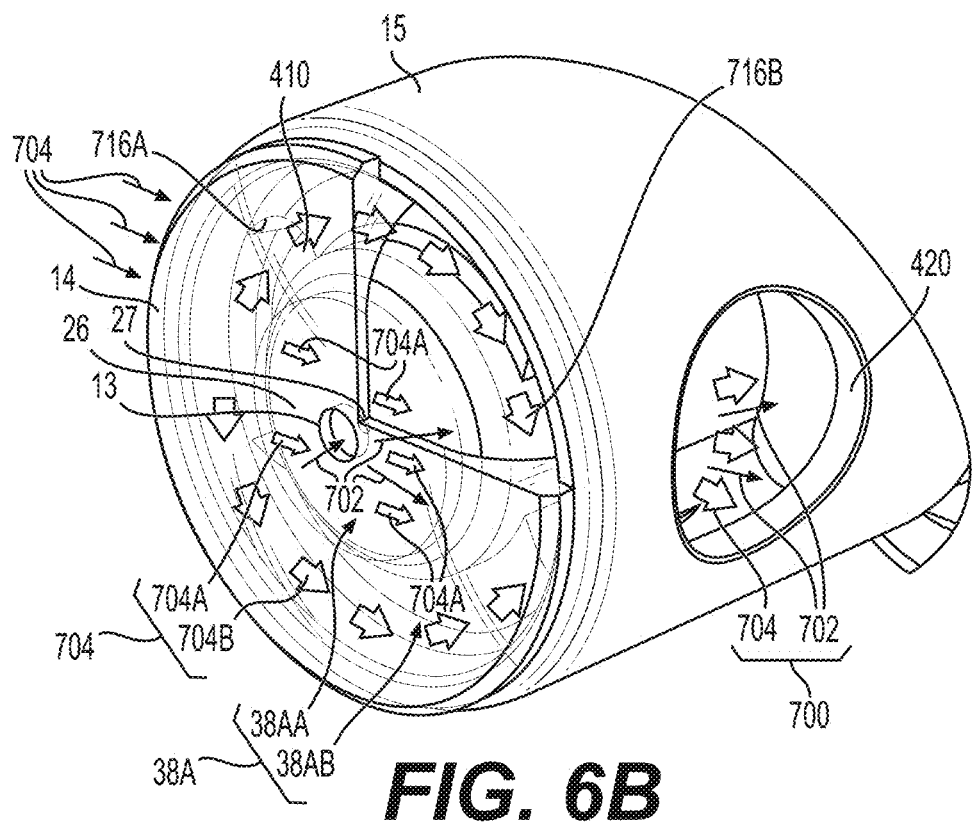
FIG. 6B is a perspective view of a portion of a jetting assembly according to some example embodiments of the technology disclosed herein.
Figure 7A:
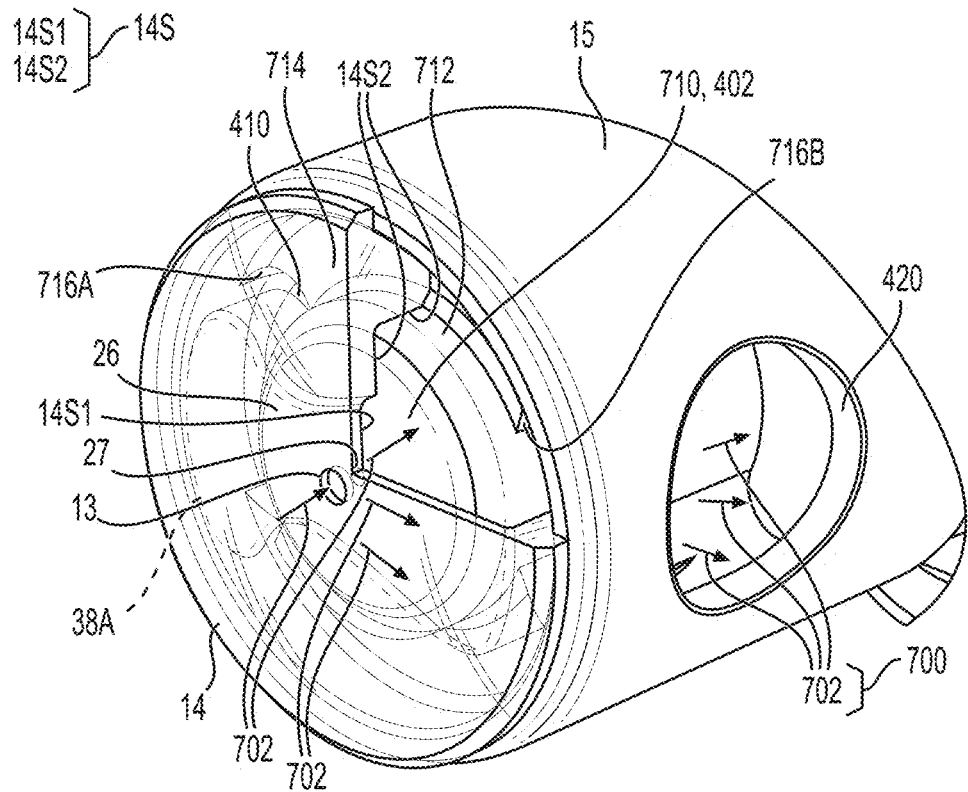
FIG. 7A is a perspective view of a portion of a jetting assembly according to some example embodiments of the technology disclosed herein.
Figure 7B:
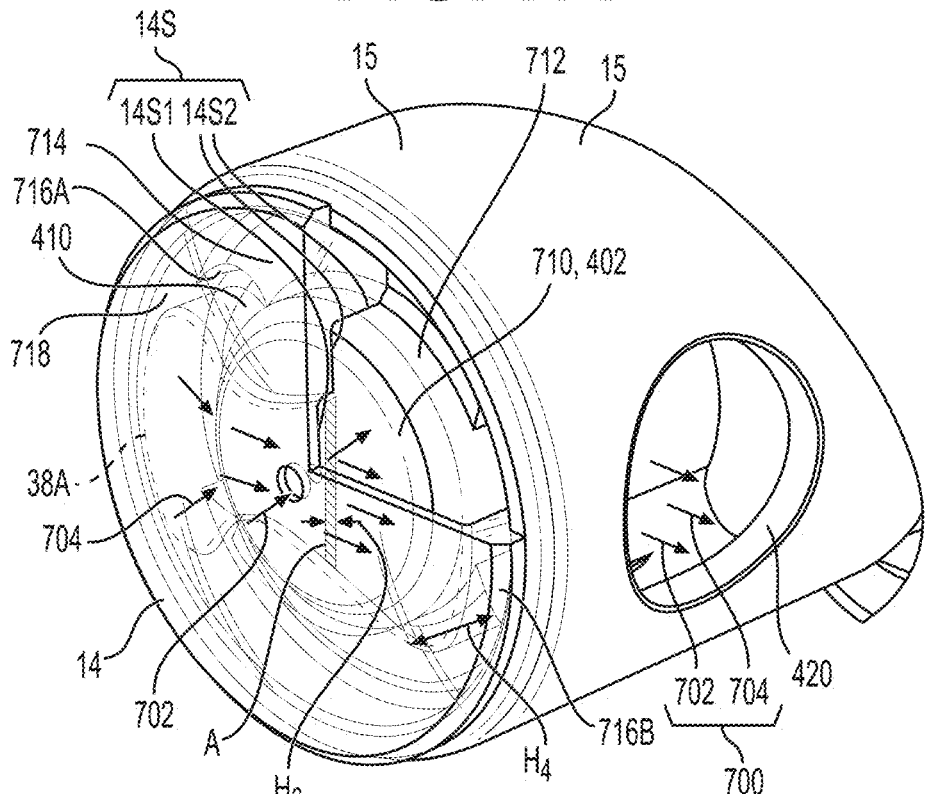
FIG. 7B is a perspective view of a portion of a jetting assembly according to some example embodiments of the technology disclosed herein.

FIG. 6A is a perspective view of a portion of a jetting assembly according to some example embodiments of the technology disclosed herein. FIG. 6B is a perspective view of a portion of a jetting assembly according to some example embodiments of the technology disclosed herein. FIG. 7A is a perspective view of a portion of a jetting assembly according to some example embodiments of the technology disclosed herein. FIG. 7B is a perspective view of a portion of a jetting assembly according to some example embodiments of the technology disclosed herein.

Referring first to FIGS. 6A and 7A, in some example embodiments, the jetting device 1 is configured to control the control valve 414, shown in FIG. 5, to restrict or inhibit the flow of the second gaseous flow 704 into the vacuum nozzle 400 via the vacuum nozzle inlet 410, such that the gaseous flow 700 that is drawn through the vacuum nozzle 400 at least partially over the jetting outlet 402 and is further drawn from the vacuum nozzle 400 toward the vacuum pump 6 via the vacuum nozzle outlet 420 is restricted to the first gaseous flow 702 of gaseous fluid that is drawn into the vacuum nozzle 400 via the suction hole 13 and is further drawn out of the vacuum nozzle 400 via the vacuum nozzle outlet 420. As shown in FIGS. 6A and 7A, the first gaseous flow 702 may be drawn to flow at least partially radially along the one or more surfaces 710 of the jetting outlet 402 and further through the vacuum nozzle 400 toward the vacuum nozzle outlet 420.

Referring now to FIGS. 6B and 7B, in some example embodiments, the jetting device 1 is configured to control the control valve 414, shown in FIG. 5, to enable the second flow 704 of gaseous fluid to be drawn into the vacuum nozzle 400 via the vacuum nozzle inlet 410, such that the gaseous flow 700 includes a combined flow of the first and second gaseous flows 702 and 704. As shown in FIGS. 6B and 7B, the second gaseous flow 704 may be drawn into the vacuum nozzle 400 via the vacuum nozzle inlet 410 and is further drawn through the first to third gas flow chambers 38A-38C such that the first and second gaseous flows 702 and 704 mix to form a combined gaseous flow 700 that is further drawn through the vacuum nozzle outlet 420 and out of the vacuum nozzle 400.

Referring now to FIGS. 6A and 6B, in some example embodiments, the first gas flow chamber 38A is defined by surfaces 710, 712, 714, 718 and the inner surface 14S of the support plate 14, where the inner surface 14S defines a bottom boundary of the first gas flow chamber 38A, gaseous flow ports 716A and 716B extend through surface 714 to establish flow communication between the vacuum nozzle inlet 410 and the vacuum nozzle outlet 420 and the first gas flow chamber 38A, respectively, and further where the inner surface 14S is spaced apart from (isolated from direct contact with) the jetting outlet 402 by spacing distance "h1"

and is further spaced apart from surface 714 by spacing distance "h2", such that the first gas flow chamber 38A that is defined by surfaces 14S, 710, 712, 714, 716, 718 includes a disc-shaped inner chamber 38AA (also referred to herein as an "inner conduit") that is between the inner surface 14S and the surface 710 of the jetting outlet 402 and an annular, cylindrically-shaped outer chamber 38AB (also referred to herein as an "outer conduit") that is defined by surfaces 712, 714, 718, 14S. As shown in FIGS. 6A and 6B, the jetting outlet 402 and the suction hole 13 at least partially define the inner chamber 38AA, while the outer chamber 38AB is not defined by the jetting outlet 402 and the suction hole and thus is at least partially isolated from the jetting outlet 402. Therefore, as shown in at least FIGS. 6A-6B, a gaseous flow that is drawn through the inner chamber 38AA would flow over the jetting outlet 402, while a gaseous flow that is drawn through the outer chamber 38AB would not flow over the jetting outlet 402.

Accordingly, as shown in FIG. 6B, when the second gaseous flow 704 is drawn into the vacuum nozzle 400 and is further drawn into the first gas flow chamber 38A via gaseous flow port 716A, the second gaseous flow 704 may flow through both the inner and outer chambers 38AA, 38AB of the first gas flow chamber 38A, such that a first portion 704A of the second gaseous flow 704 is drawn through the inner chamber 38AA and thus passes ("flows") over the jetting outlet 402, while a second portion 704B of the second gaseous flow 704, which is separate from the first portion 704A, is drawn through the outer chamber 38AB and does not pass ("flow") over the jetting outlet 402, and where the first and second portions 704A, 704B are combined at least at the vacuum nozzle outlet 720, along with the first gaseous flow 702, to define the gaseous flow 700 that is drawn through the vacuum nozzle outlet 420, via gaseous flow port 716B and the third gas flow chamber 38C, and into the suction conduit 422.

Because the inner surface 14S of the support plate 14 is shaped to define both inner and outer chambers 38AA, 38AB of the first gas flow chamber 38A, the boost to the flow velocity of the gaseous flow 700 over the jetting outlet 402 based on the addition of the second gaseous flow 704 to the first gaseous flow 704 may be reduced in relation to an entirety of the second gaseous flow 704 passing over the jetting outlet 402, as a portion 704B of the second gaseous flow 704 may pass through the outer chamber 38AB and thus avoid passing over the jetting outlet 402.

Referring now to FIGS. 7A and 7B, in some example embodiments the support plate 14 has an inner surface 14S that includes a first surface 14S1 that is spaced apart from at least a portion of the jetting outlet 402 by spacing distance "h3" and one or more surfaces 712, 714 by spacing distance "h4", and the inner surface 14S further includes a second surface 14S2 that is in direct contact with at least the surfaces 712 and 714 and further in direct contact with a portion of the surface 710 defining the jetting outlet 402. Accordingly, the inner surface 14S of the support plate 14 may define the first gas flow chamber 38A as a conduit, at least partially defined by the jetting outlet 402, that extends over a limited portion of the jetting outlet 402 such that the gaseous flow 700 is forced to flow, in its entirety, over a limited portion of the jetting outlet 402. As further shown in FIGS. 7A-7B, the inner surface 14S may define the first gas flow chamber 38A as a two-lobed conduit that extends between the gaseous flow ports 716A and 716B and has a cross-sectional flow area A that narrows in proportion to proximity to the jetting orifice 27 and suction hole 13, such that an entirety of the gaseous flow 700, which includes an entirety of the first gaseous flow 702 and an entirety of the second gaseous flow 704, is forced to flow over the jetting outlet 402 in close proximity to the jetting orifice 27 and is accelerated to a maximum flow velocity corresponding to a closest proximity to the jetting orifice 27. Additionally, based on the reduction of the cross-sectional flow area A of the first gas flow chamber 38A in relation to the cross-sectional flow area A shown in FIGS. 6A-6B, the flow velocity of the gaseous flow 700 in the example embodiments shown in FIGS. 7A-7B is increased.

Accordingly, as shown in FIG. 7B, when the second gaseous flow 704 is drawn into the vacuum nozzle 400, the second gaseous flow 704 may be forced to flow, in its entirety, over the jetting outlet 402 in combination with the first gaseous flow 702, such that the flow velocity of the gaseous flow 700 over the jetting outlet 402 is increased, thereby improving removal of viscous medium residue 590 from the jetting outlet 402 and/or the vacuum nozzle 400 by the gaseous flow 700.

Figure 8:
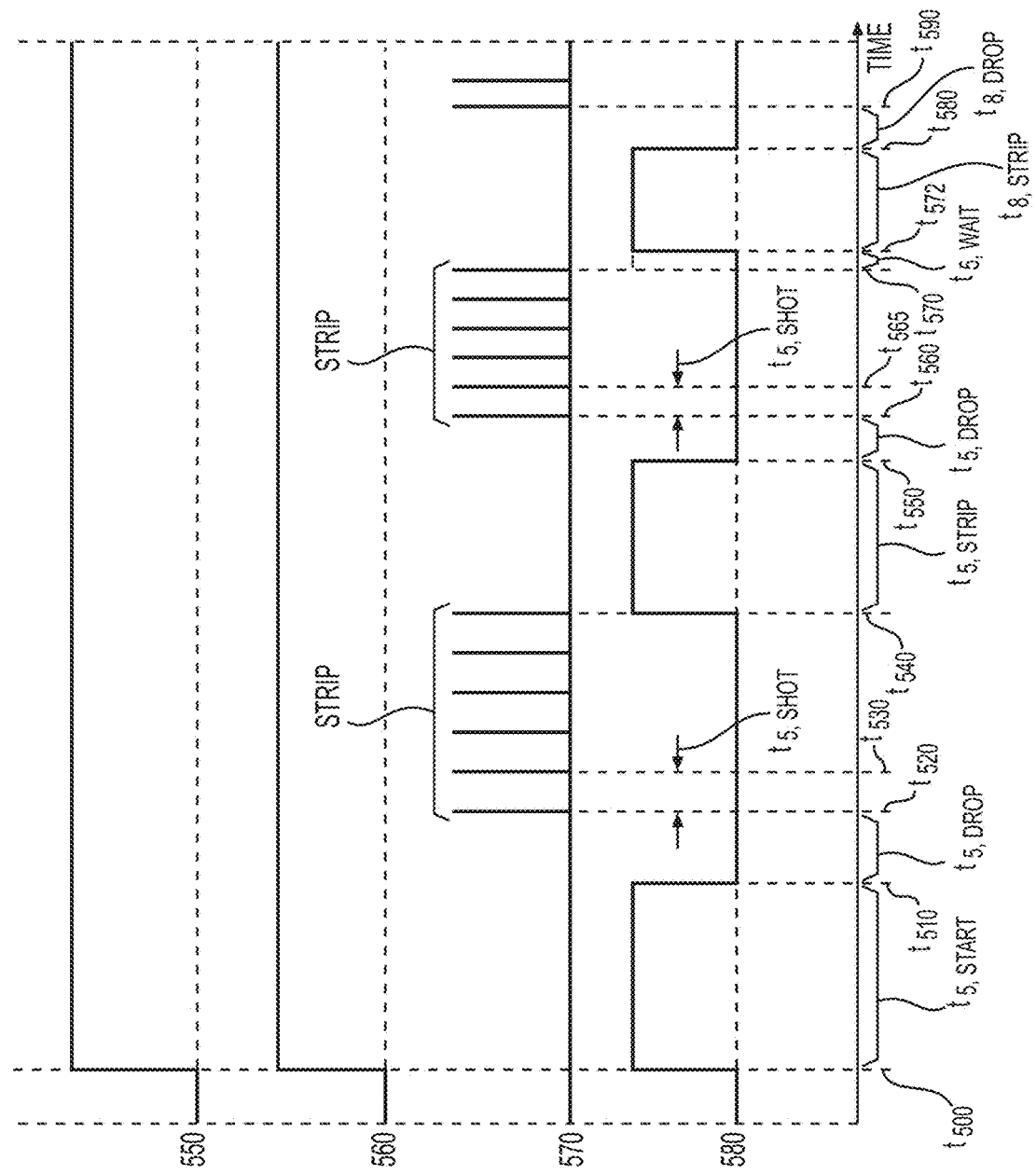
FIG. 8 is a timing chart illustrating control signals transmitted over time to at least some elements of a jetting device illustrated to cause the at least some elements of the jetting device to perform at least one operation according to some example embodiments of the technology disclosed herein.

FIG. 8 is a timing chart illustrating control signals transmitted over time to at least some elements of a jetting device illustrated to cause the at least some elements of the jetting device to perform at least one operation according to some example embodiments of the technology disclosed herein.

In some example embodiments, the control valve 414 may be configured to control the flow rate and/or flow velocity of the gaseous flow 700 drawn through at least the vacuum nozzle outlet 420 and further through the suction conduit 422 towards the vacuum pump 6, based on a controlled actuation and/or adjustment of the valve position of the control valve 414 (also referred to herein as a valve state of the control valve 414).

As described herein, a control valve, including the control valve 414 and/or any of the control valves described herein, may be one of various types of valves. For example, a control valve as described herein may be a proportional valve or an "on/off" valve. A control valve as described herein may be a solenoid valve. A proportional valve, including a proportional solenoid valve may be configured to adjust the valve state thereof based on an applied voltage, such that the valve opening ("valve position") of the control valve is proportional to the magnitude of the applied voltage. A control valve that is an on/off valve ("digital valve") may be restricted to having two valve states: fully-opened and fully-closed. A control valve, including a control valve that is an on/off solenoid valve, may be controlled by a control signal ("valve control signal") that includes a Pulse-Width Modulation ("PWM") signal.

In some example embodiments, valve control signals may be transmitted to the control valve 414 to control the valve state ("valve position", "valve opening," etc.) of the control valve 414. Such valve control signals may be generated and/or transmitted by a control device 20 of the jetting device 1.

In some example embodiments, the jetting device 1 is configured to draw a first gaseous flow 702 into the vacuum nozzle 400 through the suction hole 13 shown in at least FIG. 5, such that the gaseous flow 700 includes at least the first gaseous flow 702, as shown in FIG. 5.

In some example embodiments, the jetting device 1 is configured to draw a second gaseous flow 704 into the vacuum nozzle 400 from the ambient environment through the inlet conduit 412 and the vacuum nozzle inlet 410 shown in at least FIG. 5, such that the gaseous flow 700 includes the second gaseous flow 704 in combination with the first gaseous flow 702, as shown in FIG. 5.

In some example embodiments, control valve 414 may be configured to control a flow rate of the gaseous flow 700, thereby controlling a flow rate of the gaseous flow 700 through the suction conduit 422, based on controlling a flow rate of the second gaseous flow 704 through the inlet conduit 412 from the ambient conduit inlet 419. Controlling the flow rate of the second gaseous flow 704 may include adjustably inhibiting the second gaseous flow 704 into the vacuum nozzle 400. In some example embodiments, control valve 414 is configured to change between at least two separate valve positions, based on a control signal, to change the smallest diameter "D" of the inlet conduit 412 between a constricted diameter and an open diameter. The open diameter may correspond to a fully-open valve position of the control valve 414. In some example embodiments the smallest diameter "D" of the inlet conduit 412 is defined by a bore diameter of the control valve 414 and/or one or more inlet channels 416, 418 of the inlet conduit 412, such that the inlet conduit 412 enables a maximum flow rate of the second gaseous flow 704 into the vacuum nozzle 400 based on the control valve 414 being in a fully-open valve position. The constricted diameter may correspond to a fully-closed valve position of the control valve 414, such that the second gaseous flow 704 is inhibited based on the control valve 414 is controlled to change the smallest diameter "D" of the inlet conduit 412 to the constricted diameter. In some example embodiments, the constricted diameter may correspond to a partially-closed valve position of the control valve 414, such that the second gaseous flow 704 is reduced but not inhibited in flow rate, relative to a flow rate of the second gaseous flow 704 when the control valve 414 is in a fully-open valve position.

In some example embodiments, the gaseous flow 700 is drawn through the vacuum nozzle 400 concurrently with one or more droplets 29 of viscous medium being jetted by the jetting nozzle 26. Accordingly, a jetted droplet 29 may be exposed to a gaseous flow (e.g., at least first gaseous flow 702) that may be transverse to the direction of travel of the droplet and may influence a jetting trajectory of the droplet 29 if the flow rate of the gaseous flow is above a threshold magnitude. As a consequence, the flow rate of the gaseous flow 700 may be controlled to be at a relatively low flow rate concurrently with one or more droplets 29 being jetted by the jetting device 1 (e.g., concurrently with the jetting device performing a jetting operation of jetting a sequence of one or more droplets of viscous medium on to a substrate) to a flow rate and/or flow velocity that is at least minimally sufficient to enable removal of viscous medium residue 590 from the jetting outlet 402 and/or the vacuum nozzle 400 while simultaneously being insufficient to influence the trajectory and/or shape of one or more jetted droplets 29 of viscous medium. The gaseous flow 700 may be caused to have the relatively low flow rate (e.g., a first flow rate) based on controlling the control valve 414 to be in a first position to enable the second gaseous flow 704 to be at least partially inhibited from being drawn into and through the vacuum nozzle 400, thereby partially or entirely restricting the gaseous flow 700 to the first gaseous flow 702 being drawn into and through the vacuum nozzle 400 via suction hole 13. The first position may be a fully-closed valve position of the control valve 414. The control valve 414 may be caused to be in the first position based on transmitting a control signal having a first magnitude to the control valve 414.

In some example embodiments, the flow rate of the gaseous flow 700 may be controlled to be at a relatively high flow rate concurrently with the jetting device 1 not presently jetting a sequence of one or more droplets 29 of viscous medium on to a substrate, such that the flow rate of the gaseous flow 700 may be raised to a magnitude that is at least minimally sufficient to remove viscous medium residue 595 from one or more surfaces of the suction conduit 422 without affecting any droplets 29 jetted by the jetting device 1 during a jetting operation. The gaseous flow 700 may be caused to have the relatively high flow rate (e.g., a second flow rate) based on controlling the control valve 414 to be in a second position to enable the second gaseous flow 704 to be drawn into and through the vacuum nozzle 400, in addition to and concurrently with the first gaseous flow 702 being drawn into and through the vacuum nozzle 400, such that the gaseous flow 700 includes a combination of the maximum flow rate of the second gaseous flow 704 and the maximum flow rate of the first gaseous flow 702. The second position may be a fully-open valve position of the control valve 414. The control valve 414 may be caused to be in the second position based on transmitting a control signal having a second magnitude to the control valve 414, where the second magnitude of the control signal is different from the aforementioned first magnitude of the control signal.

Accordingly, the control valve 414 may be controlled, according to a control signal, to control the flow rate of the gaseous flow 700 during a jetting operation to enable cleaning of the jetting outlet 402 and/or vacuum nozzle 400 of viscous medium residue 590 concurrently with jetting one or more droplets 29 of viscous medium and to enable cleaning of the suction conduit 422 of viscous medium residue 595 concurrently with not jetting one or more droplets 29 of viscous medium.

FIG. 8 illustrates a timing chart showing the magnitude and/or timing of various control signals that may be generated and/or transmitted by the control device 20 of the jetting device 1 during a jetting operation. As shown, the timing chart of FIG. 8 illustrates a control signal 550 (a "flow generator control signal") transmitted to the vacuum pump 6, a control signal 560 ("valve control signal") transmitted to the control valve 427, a control signal 570 ("actuator control signal") transmitted to the actuator 21, and a control signal 580 ("valve control signal") transmitted to the control valve 414. While control signals 560 and 580 are each valve control signals, control signals 560 and 580 are separate and independent control signals that are separately and independently generated and/or transmitted to separate, independent control valves 427 and 414, respectively. In some example embodiments, control signal 560 may be omitted, as the control valve 427 may be omitted from the jetting device 1 in some example embodiments.

As shown in FIG. 8, in some example embodiments, control signal 550 may be transmitted to vacuum pump 6 to cause the vacuum pump 6 to be in continuous operation (e.g., to continuously operate to generate a gaseous flow 700) during the jetting operation. While the vacuum pump 6 may operate continuously, the vacuum pump 6 may be denied from generating a gaseous flow 700 during such operation based on whether one or more control valves of the jetting device 1 (e.g., control valve 427) close off a source of gaseous flow to the vacuum pump 6.

FIG. 8 shows example embodiments where control signal 550 is continuously transmitted to the vacuum pump 6 to cause the vacuum pump 6 to operate continuously. In some example embodiments, control signal 550 may be transmitted once to the vacuum pump 6 to cause the vacuum pump 6 to operate continuously. Based on the vacuum pump 6 operating continuously, the vacuum pump 6 may be configured to generate a gaseous flow continuously throughout the jetting operations shown in FIG. 8.

As shown in FIG. 8, in some example embodiments, control signal 560 may be transmitted to control valve 427 to cause the control valve 427 to be continuously in a fully-open valve position (also referred to herein as a fully-open valve state) during the jetting operation. FIG. 8 shows example embodiments where control signal 560 is continuously transmitted to the control valve 427 to cause the control valve 427 to continuously be in a fully-open valve position. In some example embodiments, control signal 580 may be transmitted once to the control valve 427 to cause the control valve 427 to continuously be in a fully-open valve position. Based on control valve 427 being continuously in a fully-open valve position, a gaseous flow 700 may be continuously drawn into and through the vacuum nozzle 400 and further into the suction conduit 422, where the gaseous flow 700 includes at least the first gaseous flow 702 that is drawn into the vacuum nozzle 400 through the suction hole 13, such that the gaseous flow 700 has at least a first magnitude of flow rate throughout the jetting operation, the first magnitude being at least minimally sufficient to remove the viscous medium residue 590 from the jetting outlet 402 and/or vacuum nozzle 400 while being insufficient to affect the one or more droplets 29 of viscous medium that are jetted during the jetting operation.

As shown in FIG. 8, in some example embodiments, a jetting operation may include generating and/or transmitting control signal 570 in multiple separate sets of signals, where each set of signals includes one or more "pulses" of the control signal 570 magnitude, where each set of pulses includes a set of sequentially generated/transmitted control signal 570 pulses. Each individual control signal 570 pulse may cause the actuator 21 of the jetting device 1 to jet an individual droplet 29 from the jetting nozzle 26. An individual jetting of an individual droplet 29 may be referred to herein as a "shot," and a set, or sequence, of jettings may be referred to as a "strip." Accordingly, an individual pulse of control signal 570 that corresponds to an individual shot caused by the actuator 21 may be referred to as a "shot pulse" and a set of individual pulses that collectively correspond to a strip of shots, may be referred to as a set of "strip pulses."

FIG. 8 illustrates a jetting operation that includes transmitting at least three sets of control signal 570 pulses to cause ("trigger") the actuator 21 of the jetting device 1 to jet at least three separate strips of shots of droplets 29, where at least the first two strips include at least six (6) shots. Collectively, the pattern of the sets of pulses of the control signal 570 in FIG. 8 may be referred to as an actuator control sequence, where the actuator 21 may be controlled, according to the actuator control sequence represented by the sets of control signal 570 pulses, to jet a sequence of droplets 29 of the viscous medium through the jetting outlet 402 on to a substrate.

As shown in FIG. 8, a jetting operation may be initialized at a time ("timestamp") $t_{500}$. At time $t_{520}$, the jetting operation may include jetting a first shot of a first strip, followed at time $t_{530}$ by the remaining five shots of the first strip at one or more intervals ($t_{S,SHOT}$) of elapsed time, to cause the jetting device 1 to jet a first strip of droplets. To cause the jetting device 1 to perform such a jetting, and as shown in FIG. 8, a control signal 570 pulse may be generated and/or transmitted sequentially, starting at time $t_{520}$ and at one or more intervals $t_{S,SHOT}$ from time $t_{520}$ to time $t_{540}$ to cause the jetting device 1 to jet the shots of the first strip. To cause the jetting device 1 to implement a second strip of shots, control signal 570 pulses may be generated sequentially, starting at time $t_{560}$ and at one or more intervals $t_{S,SHOT}$ from time $t_{560}$ to time $t_{570}$ to cause the jetting device 1 to jet the shots of the second strip. Each separate control signal 570 pulse may cause the actuator 21 of the jetting device 1 to jet an individual droplet 29 from jetting nozzle 26.

As shown in FIG. 8, in some example embodiments, control signal 580 may be generated and/or transmitted to control the valve state of the control valve 414, thereby to cause the control valve 414 to control the flow rate of the second gaseous flow 704 drawn to the vacuum nozzle 400 from the ambient environment via the inlet conduit 412, thereby to control the flow rate of the gaseous flow 700 through the vacuum nozzle 400 and further through the suction conduit 422.

Referring to FIG. 8, in some example embodiments, the control valve 414 may be controlled to cause the second gaseous flow 704 to be directed to flow through the vacuum nozzle 400 before and between separate strips of shots during a given jetting operation, in order to cause the flow rate of the gaseous flow 700 through the suction conduit 422 to have at least minimally sufficient magnitude to enable removal of viscous medium residue 595 accumulation from one or more surfaces 422S of the suction conduit 422. In some example embodiments, including the example embodiments shown in FIG. 8, the control valve 414 may be controlled to cause the gaseous flow through the vacuum nozzle 400 to be reduced, inhibited, or substantially inhibited (e.g., inhibited within manufacturing tolerances and/or material tolerances) during separate periods of elapsed time that encompass separate, respective strips of shots. As a result, the control valve 414 may control the gaseous flow 700 to remove viscous medium residue 595 from the suction conduit 422 immediately before, after, and/or between separate strips, thereby reducing and/or mitigating the risk of the residue 595 adversely affecting the removal of residue 590 from the jetting outlet 402 and/or vacuum nozzle 400 during the jetting operation as a result of reduction of the flow area of the suction conduit 422 by the accumulated residue 595 in the absence of the second gaseous flow 704.

As shown in FIG. 8, the pattern of adjustment of the control signal 580 magnitude over time may represent a gaseous flow control sequence via which the control valve 414 may be controlled to control the valve position of the control valve 414 and thus to control the flow rate of the gaseous flow 700 over time. Accordingly, the controlling the control valve 414 may include controlling the control valve 414 according to a gaseous flow control sequence that corresponds to the actuator control sequence, to control the flow rate of the gaseous flow 700 through the vacuum nozzle outlet 420 based on a jetting of one or more individual droplets 29 of the sequence of droplets by the actuator 21.

In some example embodiments, including the example embodiments shown in FIG. 8, control signal 580 may be generated and/or transmitted continuously from a time starting at time $t_{500}$ at which the jetting operation shown in FIG. 8 is initialized ("started"). The control signal 580 may be generated and/or transmitted continuously for a particular period of time $t_{S,START}$ that follows the starting time $t_{500}$ and extends until time $t_{510}$ that is a particular period of elapsed time $t_{S,DROP}$ preceding the first shot of the first strip. As a result, during the period of time $t_{S,START}$, the control valve 414 may be controlled by control signal 580 to be in a second position (e.g., an open or fully-open valve position), thereby causing the second gaseous flow 704 to be drawn into the vacuum nozzle 400 to mix with the first gaseous flow 702 to establish gaseous flow 700 that is drawn into the suction conduit 422 at a magnitude of flow rate that is at least minimally sufficient to enable removal of viscous medium residue 595 from one or more surfaces 422S of the suction conduit 422 by the gaseous flow 700.

As shown in FIG. 8, at time $t_{510}$ that is a particular period of elapsed time $t_{5,\ DROP}$ preceding the first shot of the first strip, control signal 580 may be inhibited and/or reduced in magnitude to a first magnitude, which may cause the control valve 414 to be adjusted to a first position (e.g., a fully-closed valve position or reduced-open valve position). As referred to herein, a control valve that is adjusted to a "reduced-open valve position" is adjusted to a valve position that has a reduced opening relative to the valve position preceding the adjustment.

As shown in FIG. 8, the control signal 580 may be inhibited until the time $t_{540}$ at which the final control signal 570 pulse corresponding to the final shot of the first strip is generated and/or transmitted. At time $t_{540}$, transmission and/or generation of the control signal 580 may be resumed, such that the control valve 414 is caused to return to the second position (e.g., a fully-open valve position or an increased-open valve position). As referred to herein, a control valve that is adjusted to an "increased-open valve position" is adjusted to a valve position that has an increased opening relative to the valve position preceding the adjustment.

In some example embodiments, the control valve 414 may be adjusted from a first valve position to a second valve position, where each of the valve positions are different and are each at least a partially-open valve position. As a result, because the control valve 414 is at least partially open in both valve position, adjusting the control valve 414 from the first valve position to the second valve position may cause the control valve 414 to change the flow rate of the second gaseous flow 704 from a first non-zero flow rate to a second non-zero flow rate, where the second non-zero flow rate is different from the first non-zero flow rate.

Still referring to FIG. 8, the control signal 580 may be maintained for a particular period of time $t_{5,\ STRIP}$ that follows time $t_{540}$ and ends at a time $t_{550}$ that is a particular amount of elapsed time $t_{5,\ DROP}$ prior to a time $t_{560}$ at which the first shot of the next strip is jetted.

As a result, during the particular period of time $t_{5,\ STRIP}$ that follows time $t_{540}$ and ends at time $t_{550}$, the control valve 414 may be controlled by control signal 580 to be in a second position (e.g., an open or fully-open valve position), thereby causing the second gaseous flow 704 to be drawn into the vacuum nozzle 400 to mix with the first gaseous flow 702 to establish gaseous flow 700 that is drawn into the suction conduit 422 at a magnitude of flow rate that is at least a minimum flow rate sufficient to enable removal of viscous medium residue 595 from one or more surfaces 422S of the suction conduit 422 by the gaseous flow 700 (e.g., associated with the gaseous flow 700 removing one or more instances of the viscous medium residue 595 from one or more surfaces 422S at least partially defining a suction conduit 422 between the vacuum nozzle outlet 420 and the vacuum pump 6). As shown, the control valve 414 may be controlled via control signal 580 to increase or initiate the flow rate of the gaseous flow 700 through the vacuum nozzle outlet 420 at least between causing adjacent sets of droplets 29 ("strips") to be jetted through the jetting outlet 402 (e.g., during time $t_{5,\ STRIP}$).

At time $t_{550}$, the control signal 560 is re-inhibited. As shown in FIG. 8, at time $t_{572}$, transmission and/or generation of the control signal 580 may be resumed, such that the control valve 414 is caused to return to the second position (e.g., a fully-open valve position or an increased-open valve position). As shown in FIG. 8, time $t_{572}$ may be a later time than $t_{570}$, such that the control valve 414 remains in the first position for a period $t_{5,\ WAIT}$ following the final control signal 570 pulse corresponding to the final shot of the second strip being generated and/or transmitted. In some example embodiments, including the example embodiments shown in FIG. 8, time $t_{572}$ may be the same as time $t_{570}$, such that the control valve 414 is caused to move to the second position simultaneously or substantially simultaneously (e.g., simultaneously within manufacturing tolerances and/or material tolerances) as the time that the final control signal 570 pulse corresponding to the final shot of the second strip is generated and/or transmitted. Restated, at time $t_{572}/t_{570}$, a triggering of an actuator to cause a droplet of viscous medium to be jetted through a jetting outlet and an adjustment of the a control valve 414 to change a flow rate of the second gaseous flow 704 may be performed simultaneously.

FIGS. 9A and 9B include images of a suction conduit of a jetting assembly according to some example embodiments of the technology disclosed herein.

In some example embodiments, a vacuum pump 6 may draw a gaseous flow 700 through the vacuum nozzle 400 of the jetting assembly 5, where the gaseous flow 700 includes at least a first gaseous flow 702 that is drawn into the vacuum nozzle 400 via a suction hole 13 through which the one or more droplets 29 of viscous medium may be jetted on to board 2, where the first gaseous flow 702 has at least a minimally sufficient flow rate and/or flow velocity to remove viscous medium residue 590 from the jetting outlet 402 and/or vacuum nozzle 400 and draw the viscous medium residue 590 out of the vacuum nozzle 400, via the vacuum nozzle outlet 420 and towards the vacuum pump 6 into the filter box 426 via the suction conduit 422. As shown in FIGS. 9A and 9B, at least some of the viscous medium residue is drawn through the end 424 of the suction conduit 422 and into the filter box 426 as viscous medium residue 904 that may be stored in the filter box 426 as waste.

FIG. 9A shows an x-ray image of a jetting device 1 during a jetting operation wherein a first gaseous flow 702 is drawn through the vacuum nozzle 400 and through the suction conduit 422 towards the filter box 426 to draw viscous medium residue 904 away from the jetting outlet 402 and into the filter box 426.

Referring to FIG. 9A, in some example embodiments, at least some viscous medium residue 590 that is entrained in the first gaseous flow and drawn into the suction conduit 422 may accumulate as residue 595 on one or more surfaces 422S of at least a portion 902 of the suction conduit 422. As shown in FIG. 9A, the effective flow area of the suction conduit 422 in portion 902 may be reduced from a full flow area A1 to a reduced flow area A1S based on the accumulation of the residue 595 on one or more surface 422S in the portion 902, which may reduce the flow rate of the gaseous flow 700 to a magnitude that is insufficient to remove viscous medium residue 590 from the jetting outlet 402 and/or vacuum nozzle 400 and may further result in a quality crash as described above.

FIG. 9B shows an x-ray image of a jetting device 1 during a jetting operation wherein a gaseous flow 700 that includes a combination of the first gaseous flow 702 and the second gaseous flow 704 is drawn through the vacuum nozzle 400 and through the suction conduit 422 towards the filter box 426 to draw viscous medium residue 904 away from the jetting outlet 402 and into the filter box 426 and to further reduce, mitigate, remove, and/or prevent the accumulation of viscous medium residue 595 on one or more surfaces 422S of the suction conduit 422.

Referring to FIG. 9B, the gaseous flow 700 that includes at least the second flow 704 that is drawn through the vacuum nozzle 400 from the ambient environment via the vacuum nozzle inlet 410 and is further drawn into the suction conduit 422 has removed the accumulation of residue 595 from the portion 902 of the suction conduit 422, which may increase the effective flow area of the suction conduit 422 back to the full flow area A1 defined by the one or more surfaces 422S of the suction conduit 422, which may increase the flow rate of the gaseous flow 700, when the gaseous flow 700 includes only the first gaseous flow 702, to a magnitude that is at least minimally sufficient to remove viscous medium residue 590 from the jetting outlet 402 and/or vacuum nozzle 400. Additionally, a need to take the jetting device 1 off-line to perform maintenance to mechanically and/or manually remove the accumulation of residue 595 from the suction conduit 422 may be mitigated and/or prevented. Accordingly, as shown in FIG. 9B, the performance of the jetting device 1 may be improved based on drawing a second gaseous flow 704 through the vacuum nozzle 400 from an ambient environment through the vacuum nozzle inlet 410, in addition to drawing the first gaseous flow 702 through the vacuum nozzle 400 through the suction hole 13.

Figure 10:
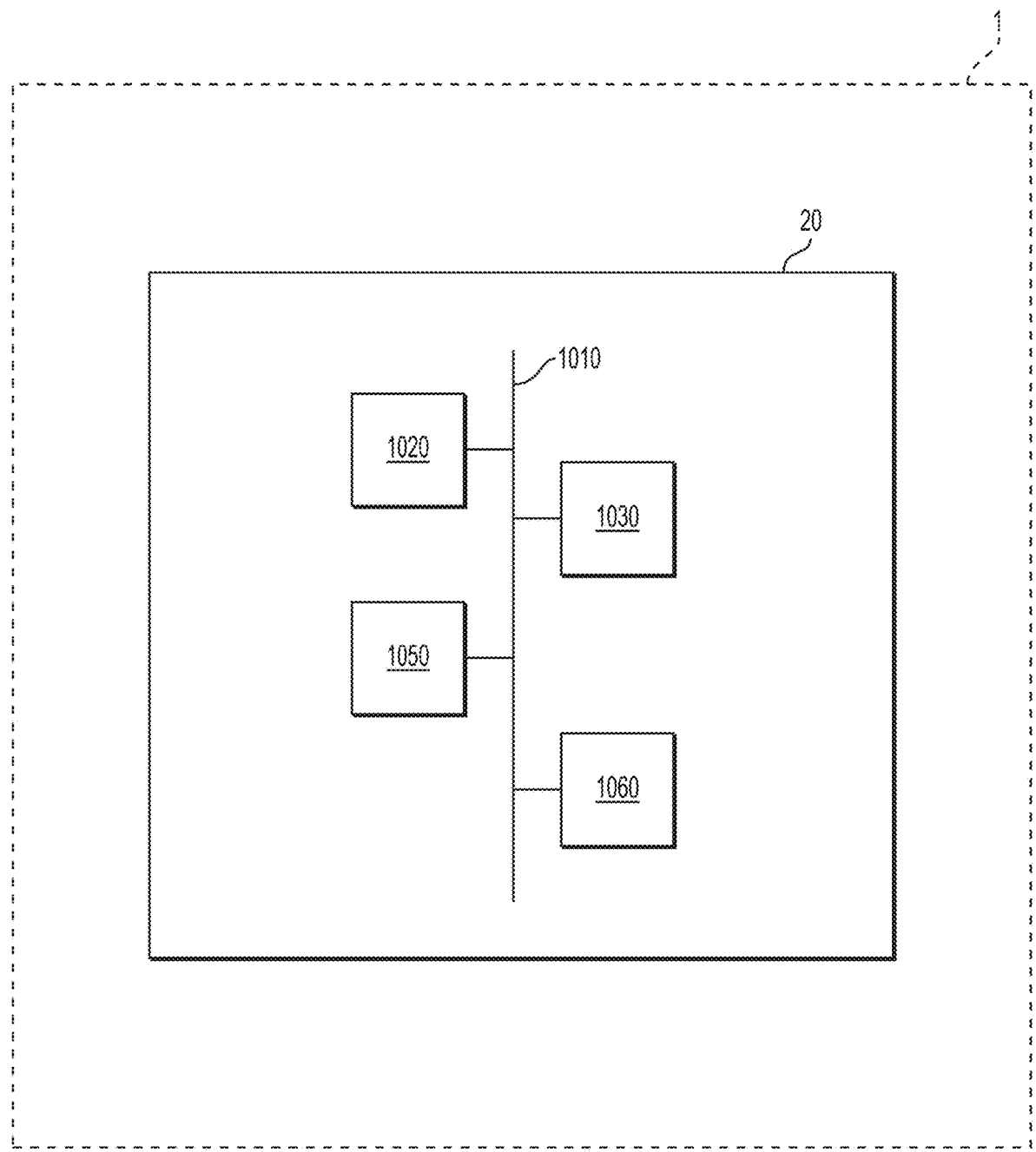
FIG. 10 is a schematic diagram illustrating a jetting device that includes a control device according to some example embodiments of the technology disclosed herein.

FIG. 10 is a schematic diagram illustrating a jetting device 1 that includes a control device 20 according to some example embodiments of the technology disclosed herein. The jetting device 1 shown in FIG. 10 may be a jetting device 1 according to any of the example embodiments illustrated and described herein, including any one of the jetting devices 1 and/or jetting assemblies 5 illustrated in FIGS. 1-5, FIGS. 6A-6B, and FIGS. 7A-7B.

Referring to FIG. 10, the control device 20 includes a memory 1020, a processor 1030, a communication interface 1050, and a control interface 1060.

In some example embodiments, including the example embodiments shown in FIG. 10, the control device 20 may be included in a jetting device 1. In some example embodiments, the control device 20 may include one or more computing devices. A computing device may include a personal computer (PC), a tablet computer, a laptop computer, a netbook, some combination thereof, or the like.

The memory 1020, the processor 1030, the communication interface 1050, and the control interface 1060 may communicate with one another through a bus 1010.

The communication interface 1050 may communicate data from an external device using various network communication protocols. For example, the communication interface 1050 may communicate sensor data generated by a sensor (not illustrated) of the control device 20 to an external device. The external device may include, for example, an image providing server, a display device, a mobile device such as, a mobile phone, a smartphone, a personal digital assistant (PDA), a tablet computer, and a laptop computer, a computing device such as a personal computer (PC), a tablet PC, and a netbook, an image outputting device such as a TV and a smart TV, and an image capturing device such as a camera and a camcorder.

The processor 1030 may execute a program of instructions and control the control device 20. The processor 1030 may execute a program of instructions to control one or more portions of the jetting device 1 via generating and/or transmitting control signals to one or more elements of the jetting device 1 via one or more control interfaces 1060. A program of instructions to be executed by the processor 1030 may be stored in the memory 1020.

The memory 1020 may store information. The memory 1020 may be a volatile or a nonvolatile memory. The memory 1020 may be a non-transitory computer readable storage medium. The memory may store computer-readable instructions that, when executed by at least the processor 1030, cause the at least the processor 1030 to execute one or more methods, functions, processes, etc. as described herein. In some example embodiments, the processor 1030 may execute one or more of the computer-readable instructions stored at the memory 1020.

In some example embodiments, the control device 20 may transmit control signals to one or more of the elements of the jetting device 1 to execute and/or control a jetting operation whereby one or more droplets are jetted to a substrate. For example, the control device 20 may transmit one or more sets of control signals to one or more flow generators, actuators, control valves, some combination thereof, or the like, according to one or more programs of instruction. Such programs of instruction, when implemented by the control device 20 may result in the control device 20 generating and/or transmitting control signals to one or more elements of the jetting device 1 to cause the jetting device 1 to perform one or more jetting operations.

In some example embodiments, the control device 20 may generate and/or transmit one or more sets of control signals according to any of the timing charts illustrated and described herein, including the timing chart illustrated in FIG. 8. In some example embodiments, the processor 1030 may execute one or more programs of instruction stored at the memory 1020 to cause the processor 1030 to generate and/or transmit one or more sets of control signals according to the timing chart illustrated in FIG. 8.

In some example embodiments, the communication interface 850 may include a user interface, including one or more of a display panel, a touchscreen interface, a tactile (e.g., "button," "keypad," "keyboard," "mouse," "cursor," etc.) interface, some combination thereof, or the like. Information may be provided to the control device 20 via the communication interface 1050 and stored in the memory 1020. Such information may include information associated with the board 2, information associated with the viscous medium to be jetted to the board 2, information associated with one or more droplets of the viscous medium, some combination thereof, or the like. For example, such information may include information indicating one or more properties associated with the viscous medium, one or more properties (e.g., size) associated with one or more droplets to be jetted to the board 2, some combination thereof, or the like.

In some example embodiments, the communication interface 850 may include a USB and/or HDMI interface. In some example embodiments, the communication interface 1050 may include a wireless network communication interface.

The foregoing description has been provided for purposes of illustration and description. It is not intended to be exhaustive. Individual elements or features of a particular example embodiment are generally not limited to that particular example, but are interchangeable where applicable and can be used in a selected embodiment, even if not specifically shown or described. The same may also be varied in many ways. Such variations are not to be regarded as a departure from example embodiments, and all such modifications are intended to be included within the scope of the example embodiments described herein.

What is claimed is:

1. A device configured to jet one or more droplets of a viscous medium, the device comprising:
   a jetting nozzle having a jetting outlet, the jetting nozzle configured to jet the one or more droplets through the jetting outlet;
   a vacuum nozzle configured to direct a gaseous flow over the jetting outlet, the vacuum nozzle including a vacuum nozzle inlet, a vacuum nozzle outlet, and a suction hole, the jetting nozzle further configured to jet the one or more droplets through the suction hole via the jetting outlet;
   a vacuum pump in flow communication with the vacuum nozzle outlet, the vacuum pump configured to generate the gaseous flow based on drawing a gaseous fluid into the vacuum nozzle and further towards the vacuum pump via the vacuum nozzle outlet; and
   an inlet conduit coupled to the vacuum nozzle inlet, such that the inlet conduit is between the vacuum nozzle inlet and an ambient environment, the inlet conduit including a control valve, the control valve configured to control a flow rate of the gaseous flow through the vacuum nozzle outlet based on adjusting a smallest diameter of the inlet conduit between an open diameter and a constricted diameter,
   wherein the open diameter of the inlet conduit is greater than a smallest diameter of the suction hole.

2. The device of claim 1, wherein
   the open diameter of the inlet conduit is at least about five-fold greater than the smallest diameter of the suction hole.

3. The device of claim 2, wherein
   the open diameter of the inlet conduit is about 1.8 millimeters, and
   the smallest diameter of the suction hole is about 0.23 millimeters.

4. The device of claim 1, wherein the vacuum pump is coupled to the vacuum nozzle outlet via a suction conduit.

5. The device of claim 1, wherein the inlet conduit includes an inlet channel, the inlet channel between the vacuum nozzle inlet and the control valve.

6. The device of claim 1, wherein the inlet conduit excludes an inlet channel, such that the control valve defines an entirety of the inlet conduit.

7. The device of claim 1, wherein the control valve is configured to change a flow rate of gaseous fluid through the inlet conduit between a first non-zero flow rate to a second non-zero flow rate, the second non-zero flow rate being different from the first non-zero flow rate.

8. The device of claim 1, wherein
   the vacuum nozzle defines an inner conduit and an outer conduit, the inner conduit at least partially defined by the jetting outlet, the outer conduit at least partially isolated from the jetting outlet, and
   the vacuum nozzle is configured to
      direct a first gaseous flow that is drawn into the vacuum nozzle via the suction hole to be drawn through the inner conduit such that the first gaseous flow flows over the jetting outlet, and
      direct a second gaseous flow that is drawn into the vacuum nozzle via the vacuum nozzle inlet to flow through the inner conduit and the outer conduit, such that
         a first portion of the second gaseous flow is drawn through the inner conduit and flows over the jetting outlet, and
         a separate, second portion of the second gaseous flow is drawn through the outer conduit and does not flow over the jetting outlet.

9. The device of claim 1, wherein
   the vacuum nozzle defines a conduit that is at least partially defined by the jetting outlet and extends over a limited portion of the jetting outlet, the conduit having a cross-sectional flow area that narrows in proportion to proximity to a jetting orifice of the jetting outlet, and
   the vacuum nozzle is configured to
      direct an entirety of a first gaseous flow that is drawn into the vacuum nozzle via the suction hole through the conduit, such that the entirety of the first gaseous flow is drawn over the limited portion of the jetting outlet, and
      direct an entirety of a second gaseous flow that is drawn into the vacuum nozzle via the vacuum nozzle inlet through the conduit, such that the entirety of the second gaseous flow is drawn over the limited portion of the jetting outlet.

10. A method for controlling a jetting of one or more droplets of a viscous medium through a jetting outlet of a jetting nozzle, the method comprising:
    controlling a vacuum pump to cause a gaseous flow of gaseous fluid to be generated and directed towards the vacuum pump via a vacuum nozzle over the jetting outlet, the vacuum nozzle including a vacuum nozzle inlet, a vacuum nozzle outlet, and a suction hole, the jetting nozzle configured to jet the one or more droplets through the suction hole via the jetting outlet, the vacuum nozzle inlet in flow communication with an ambient environment via an inlet conduit, the vacuum nozzle outlet in flow communication with the vacuum pump; and
    controlling a control valve of the inlet conduit to adjustably control a flow rate of the gaseous flow through the vacuum nozzle outlet based on adjusting a smallest diameter of the inlet conduit between an open diameter and a constricted diameter, such that the gaseous flow includes
       a first gaseous flow of gaseous fluid that is drawn into the vacuum nozzle via the suction hole, and
       an adjustable second gaseous flow of gaseous fluid that is drawn into the vacuum nozzle via the vacuum nozzle inlet.

11. The method of claim 10, wherein the open diameter of the inlet conduit is greater than a smallest diameter of the suction hole.

12. The method of claim 10, further comprising:
    controlling an actuator, according to an actuator control sequence, to jet a sequence of droplets of the viscous medium through the jetting outlet on to a substrate,
    wherein the controlling the control valve includes controlling the control valve according to a gaseous flow control sequence that corresponds to the actuator control sequence, to control the flow rate of the gaseous flow through the vacuum nozzle outlet based on a jetting of one or more individual droplets of the sequence of droplets by the actuator.

13. The method of claim 12, further comprising:
    controlling the actuator to cause a plurality of sets of droplets of the viscous medium to be jetted through the jetting outlet, each set of droplets including one or more droplets,
    wherein the controlling the control valve includes increasing or initiating the flow rate of the gaseous flow through the vacuum nozzle outlet at least between causing adjacent sets of droplets to be jetted through the jetting outlet.

14. The method of claim 10, wherein the controlling the control valve includes increasing the flow rate of the gaseous flow through the vacuum nozzle outlet to at least a minimum flow rate associated with the gaseous flow removing one or more instances of viscous medium residue from one or more surfaces at least partially defining a suction conduit between the vacuum nozzle outlet and the vacuum pump.

15. The method of claim 10, wherein the controlling the control valve includes changing a flow rate of the adjustable second gaseous flow between a first non-zero flow rate and a second non-zero flow rate, the second non-zero flow rate being different from the first non-zero flow rate.

16. The method of claim 10, further comprising:
simultaneously triggering an actuator to jet a sequence of droplets of the viscous medium through the jetting outlet on to a substrate and adjusting the control valve.

17. The method of claim 16, wherein the controlling the control valve includes reducing or inhibiting the gaseous flow through the vacuum nozzle outlet concurrently with the actuator jetting one or more droplets of the viscous medium.

18. A device configured to at least partially control a jetting device, the jetting device including an actuator configured to jet a sequence of one or more droplets of a viscous medium through a jetting outlet of the jetting device on to a substrate, the device comprising:
a memory configured to store a program of instructions; and
a processor configured to execute the program of instructions to
control a vacuum pump to cause a gaseous flow of gaseous fluid to be generated and directed towards the vacuum pump via a vacuum nozzle in flow communication with the jetting outlet, the vacuum nozzle including a vacuum nozzle inlet, a vacuum nozzle outlet, and a suction hole, the jetting device configured to jet the one or more droplets through the suction hole via the jetting outlet, the vacuum nozzle inlet in flow communication with an ambient environment via an inlet conduit, the vacuum nozzle outlet in flow communication with the vacuum pump; and
control a control valve of the inlet conduit to control a flow rate of the gaseous flow through the vacuum nozzle outlet based on adjusting a smallest diameter of the inlet conduit between an open diameter and a constricted diameter, such that the gaseous flow includes
a first gaseous flow of gaseous fluid that is drawn into the vacuum nozzle via the suction hole, and
an adjustable second gaseous flow of gaseous fluid that is drawn into the vacuum nozzle via the vacuum nozzle inlet.

19. The device of claim 18, wherein the open diameter of the inlet conduit is greater than a smallest diameter of the suction hole.

20. The device of claim 19, wherein the open diameter of the inlet conduit is at least about five-fold greater than the smallest diameter of the suction hole.

21. The device of claim 18, wherein the processor is further configured to execute the program of instructions to
control the actuator, according to an actuator control sequence, to jet a sequence of droplets of the viscous medium through the jetting outlet on to the substrate,
wherein the controlling the control valve includes controlling the control valve according to a gaseous flow control sequence that corresponds to the actuator control sequence, to control the flow rate of the gaseous flow through the vacuum nozzle outlet based on a jetting of one or more individual droplets of the sequence of droplets by the actuator.

22. The device of claim 18, wherein the processor is further configured to execute the program of instructions to
control the actuator to cause a plurality of sets of droplets of the viscous medium to be jetted through the jetting outlet, each set of droplets including one or more droplets,
wherein the controlling the control valve includes increasing or initiating the flow rate of the gaseous flow through the vacuum nozzle outlet at least between causing adjacent sets of droplets to be jetted through the jetting outlet.

23. The device of claim 18, wherein the controlling the control valve includes increasing the flow rate of the gaseous flow through the vacuum nozzle outlet to at least a minimum flow rate associated with the gaseous flow removing one or more instances of viscous medium residue from one or more surfaces at least partially defining a suction conduit between the vacuum nozzle outlet and the vacuum pump.

24. The device of claim 18, wherein the controlling the control valve includes changing a flow rate of the adjustable second gaseous flow between a first non-zero flow rate and a second non-zero flow rate, the second non-zero flow rate being different from the first non-zero flow rate.

25. The device of claim 18, wherein the processor is further configured to execute the program of instructions to
simultaneously trigger the actuator to jet a sequence of droplets of the viscous medium through the jetting outlet on to the substrate and adjust a valve position of the control valve.

26. The device of claim 18, wherein the controlling the control valve includes reducing or inhibiting the gaseous flow through the vacuum nozzle outlet concurrently with the actuator jetting one or more droplets of the viscous medium.

* * * * *